US011671029B2

(12) United States Patent
    Telefus

(10) Patent No.: US 11,671,029 B2
(45) Date of Patent: Jun. 6, 2023

(54) AC TO DC CONVERTERS

(71) Applicant: Intelesol, LLC, Danville, CA (US)

(72) Inventor: Mark Telefus, Orinda, CA (US)

(73) Assignee: Intelesol, LLC, Danville, CA (US)

( * ) Notice: Subject to any disclaimer, the term of this patent is extended or adjusted under 35 U.S.C. 154(b) by 23 days.

(21) Appl. No.: 17/367,561

(22) Filed: Jul. 5, 2021

(65) Prior Publication Data

US 2021/0336555 A1    Oct. 28, 2021

Related U.S. Application Data

(63) Continuation-in-part of application No. 16/029,546, filed on Jul. 7, 2018, now Pat. No. 11,056,981.

(51) Int. Cl.
    *H02M 7/217*    (2006.01)
    *H02M 1/08*     (2006.01)
    *H02M 1/32*     (2007.01)

(52) U.S. Cl.
    CPC ............. *H02M 7/217* (2013.01); *H02M 1/08* (2013.01); *H02M 1/081* (2013.01); *H02M 1/32* (2013.01)

(58) Field of Classification Search
    CPC .......... H02M 1/08; H02M 1/081; H02M 7/21; H02M 7/02; H02M 7/2195; H02M 7/2176; H02M 7/217
    See application file for complete search history.

(56) References Cited

U.S. PATENT DOCUMENTS

| 3,638,102 A | 1/1972 | Pelka |
| 3,777,253 A | 12/1973 | Callan |
| 4,074,345 A | 2/1978 | Ackermann |

(Continued)

FOREIGN PATENT DOCUMENTS

| CN | 109075551 B | 1/2021 |
| EP | 0016646 A1 | 10/1980 |

(Continued)

OTHER PUBLICATIONS

F. Stajano et al., "The Resurrecting Duckling: Security Issues for Ad-hoc Wireless Networks," International Workshop on Security Protocols, 1999, 11 pages.

(Continued)

*Primary Examiner* — Gustavo A Rosario-Benitez
(74) *Attorney, Agent, or Firm* — Ryan, Mason & Lewis, LLP

(57) ABSTRACT

A converter circuit includes first and second input terminals, control circuitry, and a storage capacitor. The first and second input terminals are configured for connection to an AC power supply to receive an AC signal. The control circuitry is coupled to the first and second input terminals. A terminal of the storage capacitor is coupled to an output node of the control circuitry. The storage capacitor is charged by the control circuitry and configured for use as a DC power source. The control circuitry is configured to couple the first input terminal to the storage capacitor during a portion of a positive half-cycle of the input AC signal to charge the storage capacitor and to decouple the first input terminal from the storage capacitor during an entirety of each negative half-cycle of the input AC signal, to thereby prevent discharging of the storage capacitor by the input AC signal.

20 Claims, 6 Drawing Sheets

(56) References Cited

U.S. PATENT DOCUMENTS

| | | | |
|---|---|---|---|
| 4,127,895 A | 11/1978 | Krueger | |
| 4,245,148 A | 1/1981 | Gisske et al. | |
| 4,245,184 A | 1/1981 | Billings et al. | |
| 4,245,185 A | 1/1981 | Mitchell et al. | |
| 4,257,081 A | 3/1981 | Sauer et al. | |
| 4,466,071 A | 8/1984 | Russell, Jr. | |
| 4,487,458 A | 12/1984 | Janutka | |
| 4,581,540 A | 4/1986 | Guajardo | |
| 4,631,625 A | 12/1986 | Alexander et al. | |
| 4,636,907 A | 1/1987 | Howell | |
| 4,641,233 A * | 2/1987 | Roy | G05F 1/562 323/299 |
| 4,649,302 A | 3/1987 | Damiano et al. | |
| 4,653,084 A | 3/1987 | Ahuja | |
| 4,682,061 A | 7/1987 | Donovan | |
| 4,685,046 A | 8/1987 | Sanders | |
| 4,709,296 A | 11/1987 | Hung et al. | |
| 4,760,293 A | 7/1988 | Hebenstreit | |
| 4,766,281 A | 8/1988 | Buhler | |
| 4,812,995 A | 3/1989 | Girgis et al. | |
| 4,888,504 A | 12/1989 | Kinzer | |
| 5,041,960 A * | 8/1991 | Tseruel | H02M 7/5383 363/160 |
| 5,121,282 A | 6/1992 | White | |
| 5,276,737 A | 1/1994 | Micali | |
| 5,307,257 A | 4/1994 | Fukushima | |
| 5,371,646 A | 12/1994 | Biegelmeier | |
| 5,410,745 A | 4/1995 | Friesen et al. | |
| 5,559,656 A | 9/1996 | Chokhawala | |
| 5,646,514 A * | 7/1997 | Tsunetsugu | H02M 7/2176 323/288 |
| 5,654,880 A | 8/1997 | Brkovic et al. | |
| 5,731,732 A | 3/1998 | Williams | |
| 5,793,596 A | 8/1998 | Jordan et al. | |
| 5,796,274 A | 8/1998 | Willis et al. | |
| 5,870,009 A | 2/1999 | Serpinet et al. | |
| 5,933,305 A | 8/1999 | Schmalz et al. | |
| 6,081,123 A | 6/2000 | Kasbarian et al. | |
| 6,111,494 A | 8/2000 | Fischer et al. | |
| 6,115,267 A | 9/2000 | Herbert | |
| 6,141,197 A | 10/2000 | Kim et al. | |
| 6,160,689 A | 12/2000 | Stolzenberg | |
| 6,167,329 A | 12/2000 | Engel et al. | |
| 6,169,391 B1 | 1/2001 | Lei | |
| 6,188,203 B1 | 2/2001 | Rice et al. | |
| 6,282,109 B1 * | 8/2001 | Fraidlin | H02M 7/217 363/84 |
| 6,300,748 B1 | 10/2001 | Miller | |
| 6,369,554 B1 | 4/2002 | Aram | |
| 6,483,290 B1 | 11/2002 | Hemminger et al. | |
| 6,515,434 B1 | 2/2003 | Biebl | |
| 6,538,906 B1 | 3/2003 | Ke et al. | |
| 6,756,998 B1 | 6/2004 | Bilger | |
| 6,788,512 B2 | 9/2004 | Vicente et al. | |
| 6,807,035 B1 | 10/2004 | Baldwin et al. | |
| 6,813,720 B2 | 11/2004 | Leblanc | |
| 6,839,208 B2 | 1/2005 | Macbeth et al. | |
| 6,843,680 B2 | 1/2005 | Gorman | |
| 6,906,476 B1 | 6/2005 | Beatenbough et al. | |
| 6,984,988 B2 | 1/2006 | Yamamoto | |
| 7,045,723 B1 | 5/2006 | Projkovski | |
| 7,053,626 B2 | 5/2006 | Monter et al. | |
| 7,110,225 B1 | 9/2006 | Hick | |
| 7,164,238 B2 | 1/2007 | Kazanov et al. | |
| 7,297,603 B2 | 11/2007 | Robb et al. | |
| 7,304,828 B1 | 12/2007 | Shvartsman | |
| D558,683 S | 1/2008 | Pape et al. | |
| 7,319,574 B2 | 1/2008 | Engel | |
| D568,253 S | 5/2008 | Gorman | |
| 7,367,121 B1 | 5/2008 | Gorman | |
| 7,586,285 B2 | 9/2009 | Gunji | |
| 7,595,680 B2 | 9/2009 | Morita et al. | |
| 7,610,616 B2 | 10/2009 | Masuouka et al. | |
| 7,633,727 B2 | 12/2009 | Zhou et al. | |
| 7,643,256 B2 | 1/2010 | Wright et al. | |
| 7,693,670 B2 | 4/2010 | Durling et al. | |
| 7,715,216 B2 | 5/2010 | Liu et al. | |
| 7,729,147 B1 | 6/2010 | Wong et al. | |
| 7,731,403 B2 | 6/2010 | Lynam et al. | |
| 7,746,677 B2 | 6/2010 | Unkrich | |
| 7,821,023 B2 | 10/2010 | Yuan et al. | |
| D638,355 S | 5/2011 | Chen | |
| 7,936,279 B2 | 5/2011 | Tang et al. | |
| 7,948,719 B2 | 5/2011 | Xu | |
| 8,124,888 B2 | 2/2012 | Etemad-Moghadam et al. | |
| 8,256,675 B2 | 9/2012 | Baglin et al. | |
| 8,374,729 B2 | 2/2013 | Chapel et al. | |
| 8,463,453 B2 | 6/2013 | Parsons, Jr. | |
| 8,482,885 B2 | 7/2013 | Billingsley et al. | |
| 8,560,134 B1 | 10/2013 | Lee | |
| 8,649,883 B2 | 2/2014 | Lu et al. | |
| 8,664,886 B2 | 3/2014 | Ostrovsky | |
| 8,717,720 B2 | 5/2014 | DeBoer | |
| 8,718,830 B2 | 5/2014 | Smith | |
| 8,781,637 B2 | 7/2014 | Eaves | |
| 8,817,441 B2 | 8/2014 | Callanan | |
| 8,890,371 B2 | 11/2014 | Gotou | |
| D720,295 S | 12/2014 | Dodal et al. | |
| 8,947,838 B2 | 2/2015 | Yamai et al. | |
| 9,054,587 B2 * | 6/2015 | Neyman | H02M 7/2176 |
| 9,055,641 B2 | 6/2015 | Shteynberg et al. | |
| 9,237,617 B1 * | 1/2016 | Xiong | H05B 45/14 |
| 9,287,792 B2 | 3/2016 | Telefus et al. | |
| 9,325,516 B2 | 4/2016 | Pera et al. | |
| 9,366,702 B2 | 6/2016 | Steele et al. | |
| 9,439,318 B2 | 9/2016 | Chen | |
| 9,443,845 B1 | 9/2016 | Stafanov et al. | |
| 9,502,832 B1 | 11/2016 | Ullahkhan et al. | |
| 9,509,083 B2 | 11/2016 | Yang | |
| 9,515,560 B1 | 12/2016 | Telefus et al. | |
| 9,577,420 B2 | 2/2017 | Ostrovsky et al. | |
| 9,621,053 B1 | 4/2017 | Telefus | |
| 9,774,182 B2 | 9/2017 | Phillips | |
| 9,836,243 B1 | 12/2017 | Chanler et al. | |
| D814,424 S | 4/2018 | DeCosta | |
| 9,965,007 B2 | 5/2018 | Amelio et al. | |
| 9,990,786 B1 | 6/2018 | Ziraknejad | |
| 9,991,633 B2 | 6/2018 | Robinet | |
| 10,072,942 B2 | 9/2018 | Wootton et al. | |
| 10,101,716 B2 | 10/2018 | Kim | |
| 10,187,944 B2 | 1/2019 | MacAdam et al. | |
| 10,469,077 B2 | 11/2019 | Telefus et al. | |
| D879,056 S | 3/2020 | Telefus | |
| D881,144 S | 4/2020 | Telefus | |
| 10,615,713 B2 | 4/2020 | Telefus et al. | |
| 10,645,536 B1 | 5/2020 | Barnes et al. | |
| 10,756,662 B2 | 8/2020 | Steiner et al. | |
| 10,812,072 B2 | 10/2020 | Telefus et al. | |
| 10,812,282 B2 | 10/2020 | Telefus et al. | |
| 10,819,336 B2 | 10/2020 | Telefus et al. | |
| 10,834,792 B2 | 11/2020 | Telefus et al. | |
| 10,887,447 B2 | 1/2021 | Jakobsson et al. | |
| 10,931,473 B2 | 2/2021 | Telefus et al. | |
| 10,936,749 B2 | 3/2021 | Jakobsson | |
| 10,951,435 B2 | 3/2021 | Jakobsson | |
| 10,985,548 B2 | 4/2021 | Telefus | |
| 10,992,236 B2 | 4/2021 | Telefus et al. | |
| 10,993,082 B2 | 4/2021 | Jakobsson | |
| 11,050,236 B2 | 6/2021 | Telefus et al. | |
| 11,056,981 B2 | 7/2021 | Telefus | |
| 2002/0109487 A1 | 8/2002 | Telefus et al. | |
| 2003/0052544 A1 | 3/2003 | Yamamoto et al. | |
| 2003/0063420 A1 | 4/2003 | Pahl et al. | |
| 2003/0151865 A1 | 8/2003 | Maio | |
| 2004/0032756 A1 | 2/2004 | Van Den Bossche | |
| 2004/0251884 A1 * | 12/2004 | Steffie | H02M 1/32 323/282 |
| 2005/0162139 A1 | 7/2005 | Hirst | |
| 2005/0185353 A1 | 8/2005 | Rasmussen et al. | |
| 2005/0286184 A1 | 12/2005 | Campolo | |
| 2006/0285366 A1 | 12/2006 | Radecker et al. | |
| 2007/0008747 A1 | 1/2007 | Soldano et al. | |
| 2007/0143826 A1 | 6/2007 | Sastry et al. | |
| 2007/0159745 A1 | 7/2007 | Berberich et al. | |

(56) References Cited

U.S. PATENT DOCUMENTS

| | | |
|---|---|---|
| 2007/0188025 A1 | 8/2007 | Keagy et al. |
| 2007/0236152 A1 | 10/2007 | Davis et al. |
| 2008/0006607 A1 | 1/2008 | Boeder et al. |
| 2008/0136581 A1 | 6/2008 | Heilman et al. |
| 2008/0151444 A1 | 6/2008 | Upton |
| 2008/0174922 A1 | 7/2008 | Kimbrough |
| 2008/0180866 A1 | 7/2008 | Wong |
| 2008/0204950 A1 | 8/2008 | Zhou et al. |
| 2008/0234879 A1 | 9/2008 | Fuller et al. |
| 2008/0253153 A1 | 10/2008 | Wu et al. |
| 2008/0281472 A1 | 11/2008 | Podgorny et al. |
| 2009/0034139 A1 | 2/2009 | Martin |
| 2009/0067201 A1 | 3/2009 | Cai |
| 2009/0168273 A1 | 7/2009 | Yu et al. |
| 2009/0195349 A1 | 8/2009 | Frader-Thompson et al. |
| 2009/0203355 A1 | 8/2009 | Clark |
| 2009/0213629 A1 | 8/2009 | Liu et al. |
| 2009/0284385 A1 | 11/2009 | Tang et al. |
| 2010/0091418 A1 | 4/2010 | Xu |
| 2010/0145479 A1 | 6/2010 | Griffiths |
| 2010/0145542 A1 | 6/2010 | Chapel et al. |
| 2010/0156369 A1 | 6/2010 | Kularatna et al. |
| 2010/0188054 A1 | 7/2010 | Asakura et al. |
| 2010/0231135 A1 | 9/2010 | Hum et al. |
| 2010/0231373 A1 | 9/2010 | Romp |
| 2010/0235896 A1 | 9/2010 | Hirsch |
| 2010/0244730 A1 | 9/2010 | Nerone |
| 2010/0261373 A1 | 10/2010 | Roneker |
| 2010/0284207 A1 | 11/2010 | Watanabe et al. |
| 2010/0296207 A1 | 11/2010 | Schumacher et al. |
| 2010/0309003 A1 | 12/2010 | Rousseau |
| 2010/0320840 A1 | 12/2010 | Fridberg |
| 2011/0062936 A1 | 3/2011 | Bartelous |
| 2011/0121752 A1 | 5/2011 | Newman, Jr. et al. |
| 2011/0127922 A1 | 6/2011 | Sauerlaender |
| 2011/0156610 A1 | 6/2011 | Ostrovsky et al. |
| 2011/0227615 A1* | 9/2011 | Faison .............. H03L 7/103 327/157 |
| 2011/0273103 A1 | 11/2011 | Hong |
| 2011/0292703 A1 | 12/2011 | Cuk |
| 2011/0299547 A1 | 12/2011 | Diab et al. |
| 2011/0301894 A1 | 12/2011 | Sanderford, Jr. |
| 2011/0305054 A1 | 12/2011 | Yamagiwa et al. |
| 2011/0307447 A1 | 12/2011 | Sabaa et al. |
| 2012/0026632 A1 | 2/2012 | Acharya et al. |
| 2012/0075897 A1 | 3/2012 | Fujita |
| 2012/0089266 A1 | 4/2012 | Tomimbang et al. |
| 2012/0095605 A1 | 4/2012 | Tran |
| 2012/0120700 A1* | 5/2012 | Elberbaum .......... H02M 1/081 363/128 |
| 2012/0133289 A1 | 5/2012 | Hum et al. |
| 2012/0275076 A1 | 11/2012 | Shono |
| 2012/0311035 A1 | 12/2012 | Guha et al. |
| 2013/0051102 A1 | 2/2013 | Huang et al. |
| 2013/0057247 A1 | 3/2013 | Russell et al. |
| 2013/0063851 A1 | 3/2013 | Stevens et al. |
| 2013/0066478 A1 | 3/2013 | Smith |
| 2013/0088160 A1 | 4/2013 | Chai et al. |
| 2013/0104238 A1 | 4/2013 | Balsan et al. |
| 2013/0119958 A1 | 5/2013 | Gasperi |
| 2013/0128396 A1 | 5/2013 | Danesh et al. |
| 2013/0170261 A1 | 7/2013 | Lee et al. |
| 2013/0174211 A1 | 7/2013 | Aad et al. |
| 2013/0176758 A1* | 7/2013 | Tseng ................ H02M 7/219 363/89 |
| 2013/0187631 A1 | 7/2013 | Russell et al. |
| 2013/0245841 A1 | 9/2013 | Ahn et al. |
| 2013/0253898 A1 | 9/2013 | Meagher et al. |
| 2013/0261821 A1 | 10/2013 | Lu et al. |
| 2013/0265041 A1 | 10/2013 | Friedrich et al. |
| 2013/0300534 A1 | 11/2013 | Myllymaki |
| 2013/0329331 A1 | 12/2013 | Erger et al. |
| 2014/0043732 A1 | 2/2014 | McKay et al. |
| 2014/0067137 A1 | 3/2014 | Amelio et al. |
| 2014/0074730 A1 | 3/2014 | Arensmeier et al. |
| 2014/0085940 A1 | 3/2014 | Lee et al. |
| 2014/0096272 A1 | 4/2014 | Makofsky et al. |
| 2014/0097809 A1 | 4/2014 | Follic et al. |
| 2014/0159593 A1 | 6/2014 | Chu et al. |
| 2014/0164294 A1 | 6/2014 | Osann, Jr. |
| 2014/0203718 A1 | 7/2014 | Yoon et al. |
| 2014/0246926 A1 | 9/2014 | Cruz et al. |
| 2014/0266698 A1 | 9/2014 | Hall et al. |
| 2014/0268935 A1 | 9/2014 | Chiang |
| 2014/0268956 A1* | 9/2014 | Teren .................. H02M 7/219 363/89 |
| 2014/0276753 A1 | 9/2014 | Wham et al. |
| 2014/0331278 A1 | 11/2014 | Tkachev |
| 2015/0042274 A1 | 2/2015 | Kim et al. |
| 2015/0055261 A1 | 2/2015 | Lubick et al. |
| 2015/0097430 A1 | 4/2015 | Scruggs |
| 2015/0116886 A1 | 4/2015 | Zehnder et al. |
| 2015/0154404 A1 | 6/2015 | Patel et al. |
| 2015/0155789 A1 | 6/2015 | Freeman et al. |
| 2015/0180469 A1 | 6/2015 | Kim |
| 2015/0185261 A1 | 7/2015 | Frader-Thompson et al. |
| 2015/0185262 A1 | 7/2015 | Song et al. |
| 2015/0216006 A1 | 7/2015 | Lee et al. |
| 2015/0236587 A1 | 8/2015 | Kim et al. |
| 2015/0253364 A1 | 9/2015 | Hieda et al. |
| 2015/0256355 A1 | 9/2015 | Pera et al. |
| 2015/0256665 A1 | 9/2015 | Pera et al. |
| 2015/0282223 A1 | 10/2015 | Wang et al. |
| 2015/0309521 A1 | 10/2015 | Pan |
| 2015/0317326 A1 | 11/2015 | Bandarupalli et al. |
| 2015/0355649 A1 | 12/2015 | Ovadia |
| 2015/0362927 A1 | 12/2015 | Giorgi |
| 2016/0012699 A1 | 1/2016 | Lundy |
| 2016/0018800 A1 | 1/2016 | Gettings et al. |
| 2016/0035159 A1 | 2/2016 | Ganapathy Achari et al. |
| 2016/0057841 A1 | 2/2016 | Lenig |
| 2016/0069933 A1 | 3/2016 | Cook et al. |
| 2016/0077746 A1 | 3/2016 | Muth et al. |
| 2016/0081143 A1 | 3/2016 | Wang |
| 2016/0110154 A1 | 4/2016 | Qureshi et al. |
| 2016/0117917 A1 | 4/2016 | Prakash et al. |
| 2016/0126031 A1 | 5/2016 | Wootton et al. |
| 2016/0178691 A1 | 6/2016 | Simonin |
| 2016/0181941 A1 | 6/2016 | Gratton et al. |
| 2016/0195864 A1 | 7/2016 | Kim |
| 2016/0247799 A1 | 8/2016 | Stafanov et al. |
| 2016/0259308 A1 | 9/2016 | Fadell et al. |
| 2016/0260135 A1 | 9/2016 | Zomet et al. |
| 2016/0277528 A1 | 9/2016 | Guilaume et al. |
| 2016/0294179 A1 | 10/2016 | Kennedy et al. |
| 2016/0343083 A1 | 11/2016 | Hering et al. |
| 2016/0360586 A1 | 12/2016 | Yang et al. |
| 2016/0374134 A1 | 12/2016 | Kweon et al. |
| 2017/0004948 A1 | 1/2017 | Leyh |
| 2017/0019969 A1 | 1/2017 | O'Neil et al. |
| 2017/0026194 A1 | 1/2017 | Vijayrao et al. |
| 2017/0033942 A1 | 2/2017 | Koeninger |
| 2017/0063225 A1 | 3/2017 | Guo et al. |
| 2017/0067961 A1 | 3/2017 | O'Flynn |
| 2017/0086281 A1 | 3/2017 | Avrahamy |
| 2017/0099647 A1 | 4/2017 | Shah et al. |
| 2017/0104325 A1 | 4/2017 | Eriksen et al. |
| 2017/0170730 A1 | 6/2017 | Sugiura |
| 2017/0171802 A1 | 6/2017 | Hou et al. |
| 2017/0179946 A1 | 6/2017 | Turvey |
| 2017/0195130 A1 | 7/2017 | Landow et al. |
| 2017/0212653 A1 | 7/2017 | Kanojia et al. |
| 2017/0230193 A1 | 8/2017 | Apte et al. |
| 2017/0244241 A1 | 8/2017 | Wilson et al. |
| 2017/0256934 A1 | 9/2017 | Kennedy et al. |
| 2017/0256941 A1 | 9/2017 | Bowers et al. |
| 2017/0256956 A1 | 9/2017 | Irish et al. |
| 2017/0277709 A1 | 9/2017 | Strauss et al. |
| 2017/0314743 A1 | 11/2017 | Del Castillo et al. |
| 2017/0322049 A1 | 11/2017 | Wootton et al. |
| 2017/0322258 A1 | 11/2017 | Miller et al. |
| 2017/0338809 A1 | 11/2017 | Stefanov et al. |
| 2017/0347415 A1 | 11/2017 | Cho et al. |
| 2017/0366950 A1 | 12/2017 | Arbon |

(56) References Cited

U.S. PATENT DOCUMENTS

| | | |
|---|---|---|
| 2018/0026534 A1 | 1/2018 | Turcan |
| 2018/0054460 A1 | 2/2018 | Brady et al. |
| 2018/0054862 A1 | 2/2018 | Takagimoto et al. |
| 2018/0061158 A1 | 3/2018 | Greene |
| 2018/0146369 A1 | 5/2018 | Kennedy, Jr. |
| 2018/0174076 A1 | 6/2018 | Fukami |
| 2018/0196094 A1 | 7/2018 | Fishburn et al. |
| 2018/0201302 A1 | 7/2018 | Sonoda et al. |
| 2018/0254959 A1 | 9/2018 | Mantyjarvi et al. |
| 2018/0285198 A1 | 10/2018 | Dantkale et al. |
| 2018/0287802 A1 | 10/2018 | Brickell |
| 2018/0301006 A1 | 10/2018 | Flint et al. |
| 2018/0307609 A1 | 10/2018 | Qiang et al. |
| 2018/0323723 A1* | 11/2018 | Mochizuki ............. H02M 7/12 |
| 2018/0342329 A1 | 11/2018 | Rufo et al. |
| 2018/0359039 A1 | 12/2018 | Daoura et al. |
| 2018/0359223 A1 | 12/2018 | Maier et al. |
| 2019/0003855 A1 | 1/2019 | Wootton et al. |
| 2019/0020477 A1 | 1/2019 | Antonatos et al. |
| 2019/0028869 A1 | 1/2019 | Kaliner |
| 2019/0036928 A1 | 1/2019 | Meriac et al. |
| 2019/0050903 A1 | 2/2019 | DeWitt et al. |
| 2019/0052174 A1 | 2/2019 | Gong |
| 2019/0068716 A1 | 2/2019 | Lauer |
| 2019/0086979 A1 | 3/2019 | Kao et al. |
| 2019/0087835 A1 | 3/2019 | Schwed et al. |
| 2019/0104138 A1 | 4/2019 | Storms et al. |
| 2019/0122834 A1 | 4/2019 | Wootton et al. |
| 2019/0140640 A1 | 5/2019 | Telefus et al. |
| 2019/0165691 A1 | 5/2019 | Telefus et al. |
| 2019/0207375 A1 | 7/2019 | Telefus et al. |
| 2019/0238060 A1 | 8/2019 | Telefus et al. |
| 2019/0245457 A1 | 8/2019 | Telefus et al. |
| 2019/0253243 A1 | 8/2019 | Zimmerman et al. |
| 2019/0268176 A1 | 8/2019 | Pognant |
| 2019/0280887 A1 | 9/2019 | Telefus et al. |
| 2019/0306953 A1 | 10/2019 | Joyce et al. |
| 2019/0334999 A1 | 10/2019 | Ryhorchuk et al. |
| 2019/0355014 A1 | 11/2019 | Gerber |
| 2019/0372331 A1 | 12/2019 | Liu et al. |
| 2020/0007126 A1 | 1/2020 | Telefus et al. |
| 2020/0014301 A1 | 1/2020 | Telefus |
| 2020/0014379 A1 | 1/2020 | Telefus |
| 2020/0044883 A1 | 2/2020 | Telefus et al. |
| 2020/0052607 A1 | 2/2020 | Telefus et al. |
| 2020/0053100 A1 | 2/2020 | Jakobsson |
| 2020/0106259 A1 | 4/2020 | Telefus |
| 2020/0106260 A1 | 4/2020 | Telefus |
| 2020/0106637 A1 | 4/2020 | Jakobsson |
| 2020/0120202 A1 | 4/2020 | Jakobsson et al. |
| 2020/0145247 A1 | 5/2020 | Jakobsson |
| 2020/0153245 A1 | 5/2020 | Jakobsson et al. |
| 2020/0159960 A1 | 5/2020 | Jakobsson |
| 2020/0193785 A1 | 6/2020 | Berglund et al. |
| 2020/0196110 A1 | 6/2020 | Jakobsson |
| 2020/0196412 A1 | 6/2020 | Telefus et al. |
| 2020/0260287 A1 | 8/2020 | Hendel |
| 2020/0275266 A1 | 8/2020 | Jakobsson |
| 2020/0287537 A1 | 9/2020 | Telefus et al. |
| 2020/0314233 A1 | 10/2020 | Mohalik et al. |
| 2020/0328694 A1 | 10/2020 | Telefus et al. |
| 2020/0344596 A1 | 10/2020 | Dong et al. |
| 2020/0365345 A1 | 11/2020 | Telefus et al. |
| 2020/0365346 A1 | 11/2020 | Telefus et al. |
| 2020/0365356 A1 | 11/2020 | Telefus et al. |
| 2020/0366078 A1 | 11/2020 | Telefus et al. |
| 2020/0366079 A1 | 11/2020 | Telefus et al. |
| 2020/0394332 A1 | 12/2020 | Jakobsson et al. |
| 2021/0014947 A1 | 1/2021 | Telefus et al. |
| 2021/0119528 A1 | 4/2021 | Telefus |
| 2021/0173364 A1 | 6/2021 | Telefus et al. |
| 2021/0182111 A1 | 6/2021 | Jakobsson |

FOREIGN PATENT DOCUMENTS

| | | |
|---|---|---|
| EP | 0398026 A2 | 11/1990 |
| EP | 2560063 A1 | 2/2013 |
| GB | 2458699 A | 9/2009 |
| JP | 06-053779 A | 2/1994 |
| JP | 2013230034 A | 11/2013 |
| JP | 2014030355 A | 2/2014 |
| WO | 2010110951 A1 | 9/2010 |
| WO | 2016010529 A1 | 1/2016 |
| WO | 2016110833 A2 | 7/2016 |
| WO | 2017196571 A1 | 11/2017 |
| WO | 2017196572 A1 | 11/2017 |
| WO | 2017196649 A1 | 11/2017 |
| WO | 2018075726 A1 | 4/2018 |
| WO | 2018080604 A1 | 5/2018 |
| WO | 2018080614 A1 | 5/2018 |
| WO | 2018081619 A2 | 5/2018 |
| WO | 2018081619 A3 | 5/2018 |
| WO | 2018159914 A1 | 9/2018 |
| WO | 2019133110 A1 | 7/2019 |
| WO | 2020014158 A1 | 1/2020 |
| WO | 2020014161 A1 | 1/2020 |
| WO | PCT/US19/54102 | 2/2020 |
| WO | 2020072516 A1 | 4/2020 |
| WO | PCT/US19/67004 | 4/2020 |
| WO | 2020131977 A1 | 6/2020 |
| WO | PCT/US20/33421 | 9/2020 |
| WO | 2020236726 A1 | 11/2020 |
| WO | PCT/US21/14320 | 4/2021 |
| WO | 2021112870 A1 | 6/2021 |

OTHER PUBLICATIONS

L. Sweeney, "Simple Demographics Often Identify People Uniquely," Carnegie Mellon University, Data Privacy Working Paper 3, 2000, 34 pages.

A. Narayanan et al., "Robust De-anonymization of Large Sparse Datasets," IEEE Symposium on Security and Privacy, May 2008, 15 pages.

M. Alahmad et al., "Non-Intrusive Electrical Load Monitoring and Profiling Methods for Applications in Energy Management Systems," IEEE Long Island Systems, Applications and Technology Conference, 2011, 7 pages.

K. Yang et al. "Series Arc Fault Detection Algorithm Based on Autoregressive Bispecturm Analysis," Algorithms, vol. 8, Oct. 16, 2015, pp. 929-950.

J.-E. Park et al., "Design on Topologies for High Efficiency Two-Stage AC-DC Converter," 2012 IEEE 7th International Power Electronics and Motion Control Conference—ECCE Asia, Jun. 2-5, 2012, China, 6 pages.

S. Cuk, "98% Efficient Single-Stage AC/DC Converter Topologies," Power Electronics Europe, Issue 4, 2011, 6 pages.

E. Carvou et al., "Electrical Arc Characterization for Ac-Arc Fault Applications," 2009 Proceedings of the 55th IEEE Holm Conference on Electrical Contacts, IEEE Explore Oct. 9, 2009, 6 pages.

C. Restrepo, "Arc Fault Detection and Discrimination Methods," 2007 Proceedings of the 53rd IEEE Holm Conference on Electrical Contacts, IEEE Explore Sep. 24, 2007, 8 pages.

K. Eguchi et al., "Design of a Charge-Pump Type AC-DC Converter for RF-ID Tags," 2006 International Symposium on Communications and Information Technologies, F4D-3, IEEE, 2006, 4 pages.

A. Ayari et al., "Active Power Measurement Comparison Between Analog and Digital Methods," International Conference on Electrical Engineering and Software Applications, 2013, 6 pages.

G. D. Gregory et al., "The Arc-Fault Circuit Interrupter, an Emerging Product," IEEE, 1998, 8 pages.

D. Irwin et al., "Exploiting Home Automation Protocols for Load Monitoring in Smart Buildings," BuildSys '11: Proceedings of the Third ACM Workshop on Embedded Sensing Systems for Energy-Efficiency in Buildings, Nov. 2011, 6 pages.

B. Mrazovac et al., "Towards Ubiquitous Smart Outlets for Safety and Energetic Efficiency of Home Electric Appliances," 2011 IEEE International Conference on Consumer Electronics, Berlin, German, Sep. 6-8, 2011, 5 pages.

(56) References Cited

OTHER PUBLICATIONS

J. K. Becker et al., "Tracking Anonymized Bluetooth Devices," Proceedings on Privacy Enhancing Technologies, vol. 3, 2019, pp. 50-65.
H. Siadati et al., "Mind your SMSes: Mitigating Social Engineering in Second Factor Authentication," Computers & Security, vol. 65, Mar. 2017, 12 pages.
S. Jerde, "The New York Times Can Now Predict Your Emotions and Motivations After Reading a Story," https://www.adweek.com/tv-video/the-new-york-times-can-now-predict-your-emotions-and-motivations-after-reading-a-story/, Apr. 29, 2019, 3 pages.
K. Mowery et al., "Pixel Perfect: Fingerprinting Canvas in HTML5," Proceedings of W2SP, 2012, 12 pages.
S. Kamkar, "Evercookie," https://samy.pl/evercookie/, Oct. 11, 2010, 5 pages.
M. K. Franklin et al., "Fair Exchange with a Semi-Trusted Third Party," Association for Computing Machinery, 1997, 6 pages.
J. Camenisch et al., "Digital Payment Systems with Passive Anonymity-Revoking Trustees," Journal of Computer Security, vol. 5, No. 1, 1997, 11 pages.
L. Coney et al., "Towards a Privacy Measurement Criterion for Voting Systems," Proceedings of the 2005 National Conference on Digital Government Research, 2005, 2 pages.
L. Sweeney, "k-anonymity: A Model for Protecting Privacy," International Journal of Uncertainty, Fuzziness and Knowledge-Based Systems, vol. 1, No. 5, 2002, 14 pages.
C. Dwork, "Differential Privacy," Encyclopedia of Cryptography and Security, 2011, 12 pages.
A. P. Felt et al., "Android Permissions: User Attention, Comprehension, and Behavior," Symposium on Usable Privacy and Security, Jul. 11-13, 2012, 14 pages.
S. Von Solms et al., "On Blind Signatures and Perfect Crimes," Computers & Security, vol. 11, No. 6, 1992, 3 pages.
R. Wyden, "Wyden Releases Discussion Draft of Legislation to Provide Real Protections for Americans' Privacy," https://www.wyden.senate.gov/news/press-releases/wyden-releases-discussion-draft-of-legislation-to-provide-real-protections-for-americans-privacy, Nov. 1, 2018, 3 pages.
M. Rubio, "Rubio Introduces Privacy Bill to Protect Consumers While Promoting Innovation," https://www.rubio.senate.gov/public/index.cfm/2019/1/rubio-introduces-privacy-bill-to-protect-consumers-while-promoting-innovation#:%7E:text=Washingt%E2%80%A6, Jan. 16, 2019, 2 pages.
C. Dwork et al., "Differential Privacy and Robust Statistics," 41st ACM Symposium on Theory of Computing, 2009, 10 pages.
J. Camenisch et al., "Compact E-Cash," Eurocrypt, vol. 3494, 2005, pp. 302-321.
D. L. Chaum, "Untraceable Electronic Mail, Return Addresses, and Digital Pseudonyms," Communications of the ACM, vol. 24, No. 2, Feb. 1981, pp. 84-88.
J. Camenisch et al., "An Efficient System for Nontransferable Anonymous Credentials With Optional Anonymity Revocation," International Conference on the Theory and Application of Cryptographic Techniques, May 6-10, 2001, 30 pages.
M. K. Reiter et al., "Crowds: Anonymity for Web Transactions," ACM Transactions on Information and System Security, vol. 1, 1997, 23 pages.
I. Clarke et al., "Freenet: A Distributed Anonymous Information Storage and Retrieval System," International Workshop on Designing Privacy Enhanching Technologies: Design Issues in Anonymity and Unobservability, 2001, 21 pages.
P. Golle et al., "Universal Re-encryption for Mixnets," Lecture Notes in Computer Science, Feb. 2004, 15 pages.
Y. Lindell et al., "Multiparty Computation for Privacy Preserving Data Mining," Journal of Privacy and Confidentiality, May 6, 2008, 39 pages.
J. Hollan et al., "Distributed Cognition: Toward a New Foundation for Human-Computer Interaction Research," ACM Transactions on Computer-Human Interaction, vol. 7, No. 2, Jun. 2000, pp. 174-196.
A. Adams et al., "Users are Not the Enemy," Communications of the ACM, Dec. 1999, 6 pages.
A. Morton et al., "Privacy is a Process, Not a Pet: a Theory for Effective Privacy Practice," Proceedings of the 2012 New Security Paradigms Workshop, Sep. 2012, 18 pages.
G. D. Abowd et al., "Charting Past, Present and Future Research in Ubiquitous Computing," ACM Transactions on Computer-Human Interaction, vol. 7, No. 1, Mar. 2000, pp. 29-58.
W. Mason et al., "Conducting Behavioral Research on Amazon's Mechanical Turk," Behavior Research Methods, Jun. 2011, 23 pages.
G. M. Gray et al., "Dealing with the Dangers of Fear: The Role of Risk Communication," Health Affairs, Nov. 2002, 11 pages.
L. Shengyuan et al., "Instantaneous Value Sampling AC-DC Converter and its Application in Power Quantity Detection," 2011 Third International Conference on Measuring Technology and Mechatronics Automation, Jan. 6-7, 2011, 4 pages.
H.-H. Chang et al., "Load Recognition for Different Loads with the Same Real Power and Reactive Power in a Non-intrusive Load-monitoring System," 2008 12th International Conference on Computer Supported Cooperative Work in Design, Apr. 16-18, 2008, 6 pages.
U.S. Appl. No. 17/047,613 filed in the name of Mark Telefus et al. on Oct. 14, 2020, and entitled "Intelligent Circuit Breakers."
U.S. Appl. No. 17/154,625 filed in the name of Mark Telefus et al. on Jan. 21, 2021, and entitled "Intelligent Circuit Interruption."
U.S. Appl. No. 17/224,067 filed in the name of Mark Telefus et al. on Apr. 6, 2021, and entitled "Solid-State Line Disturbance Circuit Interrupter."
U.S. Appl. No. 63/064,399 filed in the name of Mark Telefus et al. on Aug. 11, 2020, and entitled "Energy Traffic Monitoring and Control System."

* cited by examiner

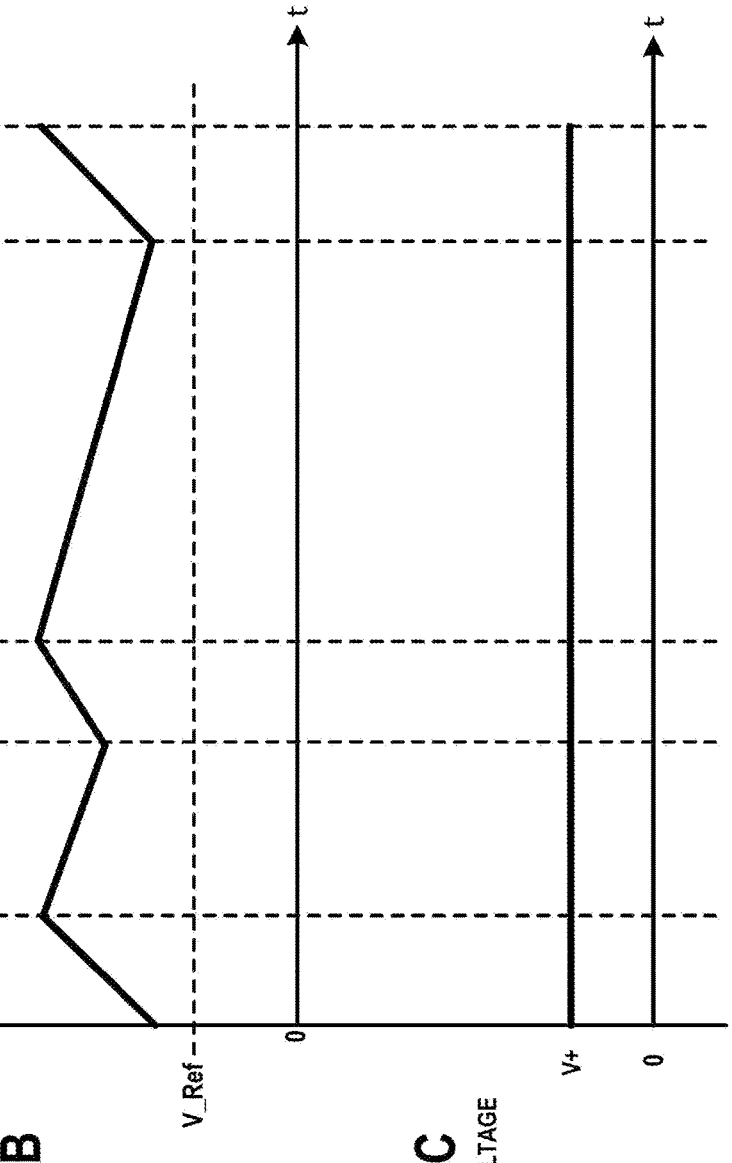
FIG. 2A AC WAVEFORM 200
FIG. 2B V_Cap 210
FIG. 2C DC OUTPUT VOLTAGE V_DC 220

AC TO DC CONVERTERS

CROSS-REFERENCE TO RELATED APPLICATION

This application is a Continuation-in-Part of U.S. patent application Ser. No. 16/029,546, filed on Jul. 7, 2018, the disclosure of which is fully incorporated herein by reference.

BACKGROUND

Conventional approaches for converting alternating current (AC) voltage to direct current (DC) voltage employ various analog circuitry to achieve AC to DC conversion. However, such approaches undesirably require many circuit components which may cause signal processing delay, inaccuracy, and/or overall increased cost to implement AC to DC converters.

SUMMARY

Exemplary embodiments of the disclosure include AC to DC converters. For example, in one exemplary embodiment, a converter circuit comprises a first input terminal, a second input terminal, control circuitry, and a storage capacitor. The first and second input terminals are configured for connection to an AC power supply to receive as input an AC signal. The control circuitry is coupled to the first and second input terminals. The storage capacitor comprises a first terminal coupled to an output node of the control circuitry. The storage capacitor is charged by the control circuitry and configured for use as a DC power source of the converter circuit. The control circuitry is configured to couple the first input terminal of the converter circuit to the first terminal of the storage capacitor during at least a portion of a positive half-cycle of the input AC signal to thereby charge the storage capacitor during the portion of the positive half-cycle of the input AC signal. The control circuitry is further configured to decouple the first input terminal of the converter circuit from the first terminal of the storage capacitor during an entirety of each negative half-cycle of the input AC signal, to thereby prevent discharging of the storage capacitor by the input AC signal.

Another exemplary embodiment includes a converter circuit which comprises a first input terminal, a second input terminal, control circuitry, and a storage capacitor. The first and second input terminals are configured for connection to an AC power supply to receive as input an AC signal. The control circuitry is coupled to the first and second input terminals. The storage capacitor comprises a first terminal coupled to an output node of the control circuitry. The storage capacitor is charged by the control circuitry and configured for use as a DC power source of the converter circuit to output DC power to a load that is coupled to an output terminal of the converter circuit. The control circuitry is configured to monitor a voltage level across the storage capacitor during a positive half-cycle of the input AC signal to determine whether the voltage level is greater than or less than a threshold voltage. The control circuitry is further configured to couple the first input terminal of the converter circuit to the first terminal of the storage capacitor to thereby charge the storage capacitor during the positive half-cycle, in response to determining that the voltage level across the storage capacitor is less than the threshold voltage. The control circuitry is further configured to decouple the first input terminal of the converter circuit from the first terminal of the storage capacitor during the positive half-cycle, in response to determining that the voltage level across the storage capacitor is greater than the threshold voltage. The control circuitry is further configured to decouple the first input terminal of the converter circuit from the first terminal of the storage capacitor during an entirety of each negative half-cycle of the input AC signal, to thereby prevent discharging of the storage capacitor by the input AC signal.

Another exemplary embodiment includes a converter circuit which comprises a first input terminal, a second input terminal, control circuitry, a storage capacitor, and a voltage regulator circuit. The first and second input terminals are configured for connection to an AC power supply to receive as input an AC signal. The control circuitry is coupled to the first and second input terminals. The storage capacitor comprises a first terminal coupled to an output node of the control circuitry, and a second terminal coupled to the second input terminal. The voltage regulator circuit comprises an input coupled to the first terminal of the storage capacitor, and an output coupled to a first output terminal of the converter circuit. The voltage regulator circuit is configured to generate a regulated DC voltage on the first output terminal of the converter circuit. The control circuitry is configured to couple the first input terminal of the converter circuit to the first terminal of the storage capacitor during a first portion and a second portion of each positive half-cycle of the input AC signal to thereby charge the storage capacitor during the first and second portions of each positive half-cycle of the input AC signal. The control circuitry is further configured to decouple the first input terminal of the converter circuit from the first terminal of the storage capacitor during a third portion of each positive half-cycle of the input AC signal, and during an entirety of each negative half-cycle of the input AC signal, to thereby utilize the charged storage capacitor as an DC voltage source to drive the input of the voltage regulator circuit to maintain the regulated DC voltage on the first output terminal of the converter circuit.

Other embodiments will be described in the following detailed description of exemplary embodiments, which is to be read in conjunction with the accompanying figures.

BRIEF DESCRIPTION OF THE DRAWINGS

FIGS. 2A, 2B, and 2C depict exemplary waveform diagrams which illustrate an exemplary mode of operation of the AC to DC converter circuit of FIG. 1A, according to an exemplary embodiment of the disclosure.

DETAILED DESCRIPTION

Embodiments of the disclosure will now be described in further detail with regard to circuits, devices, and techniques for generating DC power from AC power. It is to be understood that same or similar reference numbers are used throughout the drawings to denote the same or similar features, elements, or structures, and thus, a detailed explanation of the same or similar features, elements, or structures will not be repeated for each of the drawings. The term "exemplary" as used herein means "serving as an example, instance, or illustration". Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., ASICs, FPGAs, etc.), processing devices (e.g., CPUs, GPUs, etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

Figure 1A:
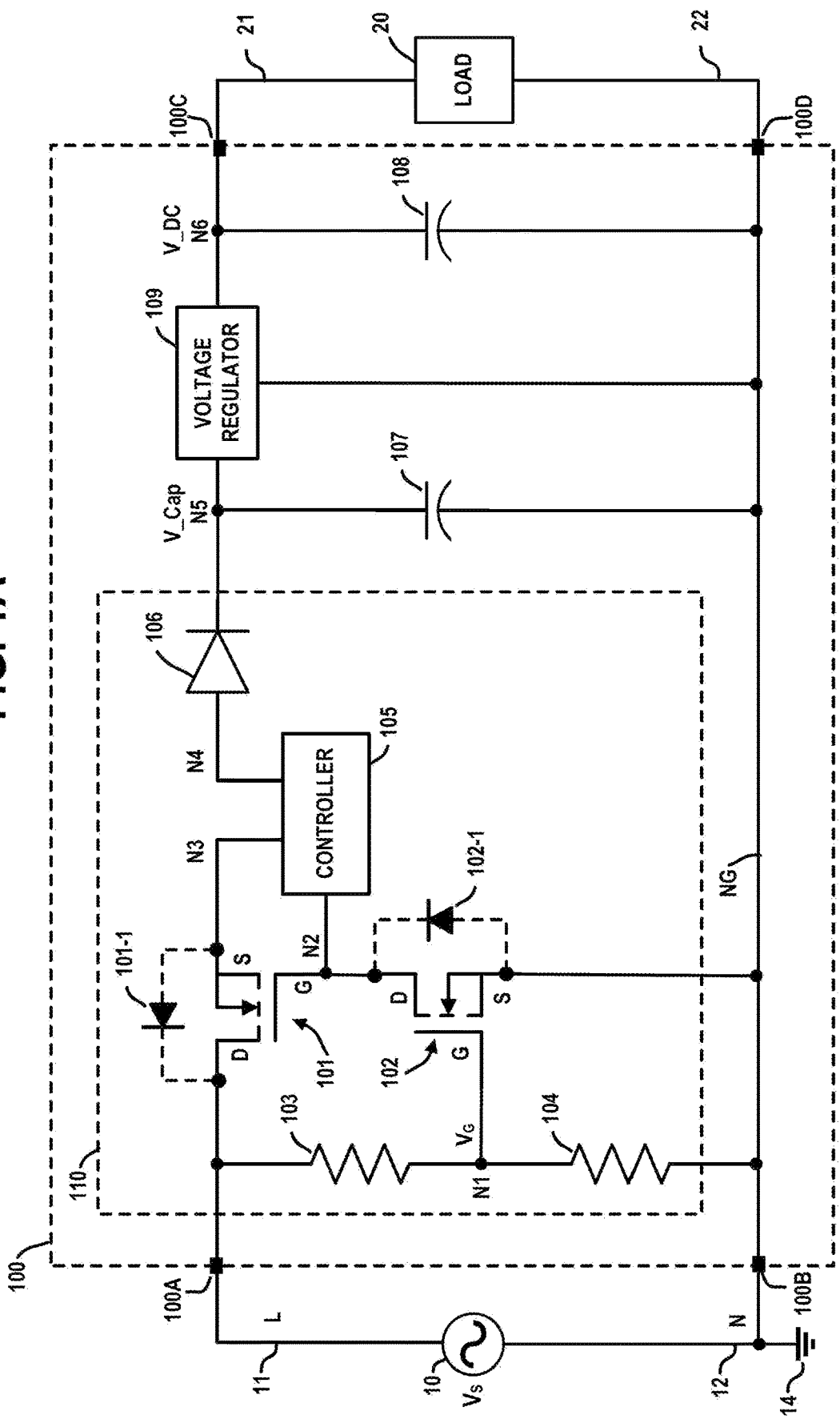
FIG. 1A schematically illustrates an AC to DC converter circuit, according to an exemplary embodiment of the disclosure.

FIG. 1A schematically illustrates an AC to DC converter circuit, according to an exemplary embodiment of the disclosure. In particular, FIG. 1A schematically illustrates an AC to DC converter circuit 100 (or converter circuit 100) connected between an AC power supply 10 and a load 20. In some embodiments, the AC power supply 10 comprises a utility power supply (or AC mains) which provides an AC voltage signal ($V_S$) with a frequency of 60 Hz and a voltage of 120V RMS (a peak value of about 170V). In other embodiments, the AC power supply 10 can be other sources of AC power at different voltage levels and/or frequencies. The converter circuit 100 comprises a first input terminal 100A, a second input terminal 100B, a first output terminal 100C, and a second output terminal 100D. The first and second input terminal 100A and 100B are coupled to a hot phase 11 (referred to as "line hot L") and a neutral phase 12 (referred to as "line neutral N") of the AC power supply 10, respectively. The first and second output terminals 100C and 100D are coupled to a positive DC input 21 and a negative DC input 22 of the load 20. As further illustrated in FIG. 1A, the line neutral 12 is shown bonded to earth ground 14 (GND), which provides added protection as is known in the art. The earth ground 14 is typically connected to a ground bar in a circuit breaker distribution panel, wherein the ground bar is bonded to a neutral bar in the circuit breaker distribution panel.

The converter circuit 100 comprises a first solid-state switch 101, a second solid-state switch 102, a first resistor 103, a second resistor 104, a controller 105, a diode 106, a first capacitor 107 (alternatively, storage capacitor 107), a second capacitor 108 (alternatively, filter capacitor 108), and a voltage regulator circuit 109. In some embodiments, the first and second solid-state switches 101 and 102 comprise power MOSFET (metal-oxide semiconductor field-effect transistor) devices and, in particular, N-type enhancement MOSFET devices having gate (G) terminals, drain (D) terminals, and source (S) terminals, as shown. The first and second solid-state switches 101 and 102 (alternatively, first and second switches 101 and 102) comprise respective intrinsic body diodes 101-1 and 102-1, which represent P-N junctions between a P-type substrate body and N-doped drain regions of the MOSFET devices. In this regard, the body diodes 101-1 and 102-1 are intrinsic elements of the respective first and second solid-state switches 101 and 102 (i.e., not discrete elements). It is to be noted that the intrinsic body-to-source diodes of the first and second solid-state switches 101 and 102 are not shown as it is assumed that they are shorted out by connections between the source regions and the substrate bodies (e.g., N+ source and P body junction are shorted through source metallization).

The first and second resistors 103 and 104 are connected in series between the first and second input terminals 100A and 100B. In this configuration, the first and second resistors 103 and 104 form a resistive voltage divider circuit which is configured to generate a voltage on a first node N1 (e.g., gate voltage (VG)) to drive the second switch 102. The first switch 101 has a gate (G) terminal coupled to a second node N2, a drain (D) terminal coupled to the first input terminal 100A (alternatively, first input node), and a source (S) terminal coupled to a third node N3. The second switch 102 has a gate (G) terminal coupled to the first node N1, a drain (D) terminal coupled to the second node N2, and a source (S) terminal coupled to a ground node (NG) of the converter circuit 100. In the exemplary embodiment of FIG. 1A, the second input terminal 100B and the second output terminal 100D are commonly connected to the ground node NG of the converter circuit 100 such that the ground node NG essentially comprises the second input terminal 100B and the second output terminal 100D.

The controller 105 is coupled to the second node N2, the third node N3, and to a fourth node N4. The diode 106 has an anode terminal coupled to the fourth node N4, and a cathode terminal coupled to a fifth node N5. The storage capacitor 107 has a first terminal coupled to the fifth node N5, and a second terminal coupled to the ground node NG. The filter capacitor 108 has a first terminal coupled to a sixth node N6, and a second terminal coupled to the ground node NG. The voltage regulator circuit 109 has an input coupled to the fifth node N5, and an output coupled to the sixth node N6. The first output terminal 100C is coupled to the sixth node N6 such that the first output terminal 100C and the sixth node N6 essentially comprise an output node of the converter circuit 100.

In some embodiments, the converter circuit 100 comprises control circuitry 110 which comprises the first and second switches 101 and 102, the first and second resistors 103 and 104, the controller 105, and the diode 106. The control circuitry 110 is coupled to the first and second input terminals 100A and 100B and is configured to receive as input positive and negative half-cycles of the AC signal $V_S$ provided by the AC power supply 10. In general, the control circuitry 110 is configured to couple the first input terminal 100A of the converter circuit 100 to the fifth node N5 (which is coupled to the first terminal of the storage capacitor 107 and to the input of the voltage regulator circuit 109), during a portion of each positive half-cycle the input AC signal $V_S$ to thereby utilize the input AC signal $V_S$ as a power source to charge the storage capacitor 107, and for the voltage regulator circuit 109 to generate a regulated DC voltage (V_DC) which is output on the first output terminal 100C of the converter circuit 100.

Moreover, the control circuitry 110 is configured to decouple the first input terminal 100A of the converter circuit 100 from the fifth node N5 (e.g., decouple the AC input signal $V_S$ from the first terminal of the storage capacitor 107 and from the input of the voltage regulator circuit 109) during a portion of each positive half-cycle the input AC signal $V_S$, and during an entirety of each negative half-cycle the input AC signal $V_S$, to thereby utilize the charged storage capacitor 107 as a DC power source (e.g., DC voltage source) to drive the input of the voltage regulator circuit 109 to maintain the regulated DC voltage on the first output terminal 100C of the converter circuit 100. The second capacitor 108 is configured as a line filter capacitor to filter out AC noise on the output node N6 (or first output terminal 100C).

With the exemplary configuration of the converter circuit 100 as shown in FIG. 1A, the storage capacitor 107 is charged only during certain portions of each positive half-cycle of the input AC signal $V_S$, while the stored charge of the storage capacitor 107 is utilized to drive the voltage regulator circuit 109 to generate and maintain the regulated DC voltage during (i) a middle (peak) portion of each positive half-cycle of the input AC signal $V_S$, and (ii) the entirety of each negative half-cycle of the input AC signal $V_S$. In this regard, the converter circuit 100 provides an AC to DC conversion mode of operation which advantageously conserves electrical energy by eliminating the need for continuous AC to DC conversion using the entirety of the positive and negative half-cycles of the input AC voltage signal. A more detailed explanation of the operation of the converter circuit 100 will now be provided.

The control circuitry 110 is configured to sample a portion of each positive half-cycle of the input AC signal $V_S$ to charge the storage capacitor 107. The controller 105 is configured to generate a gate-to-source voltage ($V_{GS}$) across nodes N2 and N3, which is applied to the first switch 101 to enable operation of the first switch 101. During a positive half-cycle of the input AC signal $V_S$, the diode 106 is forward-biased, and a positive current flows through the first switch 101, through an internal connection in the controller 105, through the forward-biased diode 106, and through the storage capacitor 107, and back to the AC power supply 10 via the ground node NG. This positive current flow causes the storage capacitor 107 to be charged. On the other hand, during a negative half-cycle the input AC signal $V_S$, the diode 106 is reverse-biased, which prevents current flow in the electrical from the fifth node N5 to the input terminal 100A and, thus, prevents discharging of the storage capacitor 107 due to the negative phase of the input AC signal $V_S$. During a negative half-cycle of the input AC signal $V_S$, the charged storage capacitor 107 operates as a DC power source (e.g., DC voltage source) to drive the input of the voltage regulator circuit 109 to maintain the regulated DC voltage V_DC on the first output terminal 100C of the converter circuit 100.

While the voltage on the storage capacitor 107 may decrease due to discharging of the storage capacitor 107 when operating a DC power source to drive the input of the voltage regulator circuit 109 during the negative half-cycle of the input AC signal $V_S$, the storage capacitor 107 will be recharged during a portion of a next positive half-cycle of the input AC signal $V_S$ when the first switch 101 is in an ON state. During a middle (peak) portion of the positive half-cycle of the input AC signal $V_S$, the first switch 101 is deactivated in response to activation of the second switch 102. The activation and deactivation of the second switch 102 during a positive half-cycle of the input AC signal $V_S$ is a result of the gate voltage VG on the first node N1 rising above and falling below a threshold voltage ($V_{TH}$) of the second switch 102.

More specifically, as noted above, the first and second resistors 103 and 104 form a resistive voltage divider circuit which generates a gate voltage VG on the first node N1 to drive the second switch 102. At any given time, the gate voltage VG on the first node N1 is determined by:

$$V_G = V_S \left( \frac{R2}{R1 + R2} \right),$$

where $V_S$ denotes the voltage of the AC voltage waveform provided by the AC power supply 10, R1 denotes a resistance of the first resistor 103, and R2 denotes a resistance of the second resistor 104. In this regard, the voltage $V_G$ on the node N1 will be an AC voltage which is proportional to the AC voltage signal $V_S$ provided by the AC power supply 10, and which increases and decreases based on the phase of the input AC voltage signal $V_S$.

In this configuration, the second switch 102 will be in an OFF state (deactivated) during portions (e.g., beginning and ending portions) of the positive half-cycle of the input AC signal $V_S$ in which the voltage $V_G$ on the node N1 is less than the threshold voltage of the second switch 102. When the second switch 102 is in an OFF state during the positive half-cycle of the input AC signal $V_S$, the first switch 101 will be in an ON state, allowing the storage capacitor 107 to be charged using current from the AC power supply 10. On the other hand, the second switch 102 will be in an ON state (activated) during a portion of a positive half-cycle of the input AC signal $V_S$ when the gate voltage $V_G$ on the first node N1 meets or exceeds the threshold voltage of the second switch 102. For example, the second switch 102 will be in an ON state during a middle portion of the positive half-cycle of the input AC signal $V_S$ (which has a peak voltage) between the beginning and ending portions of the positive half-cycle.

When the second switch 102 is turned ON during the positive half-cycle of the input AC signal $V_S$, the gate (G) terminal of the first switch 101 is pulled down to the ground node NG, which causes the first switch 101 to turn OFF. When the first switch 101 is turned OFF, no charging current flows from the AC power supply 10 to the storage capacitor 107. Instead, the storage capacitor 107 become a DC voltage source for the voltage regulator circuit 109 to maintain the regulated DC voltage V_DC on the first output terminal 100C. An exemplary mode of operation of the converter circuit 100 will be discussed in further detail below in conjunction with the exemplary waveform diagrams of FIGS. 2A, 2B, and 2C.

In some embodiments, the controller 105 performs various functions such as generating a gate voltage to drive the first switch 101, detecting the occurrence of a fault condition by sensing a level of current flowing in an electrical path of the converter circuit 100, implementing a force-turn off control function to deactivate the operation of the converter circuit 100, etc. In some embodiments, the controller 105 comprises a microprocessor, a microcontroller, an application-specific integrated circuit (ASIC), a field-programmable gate array (FPGA), or another type of programmable device, which is configured to implement control functions as described herein. In some embodiments, the controller 105 implements control circuitry as schematically illustrated in FIG. 1B.

Figure 1B:
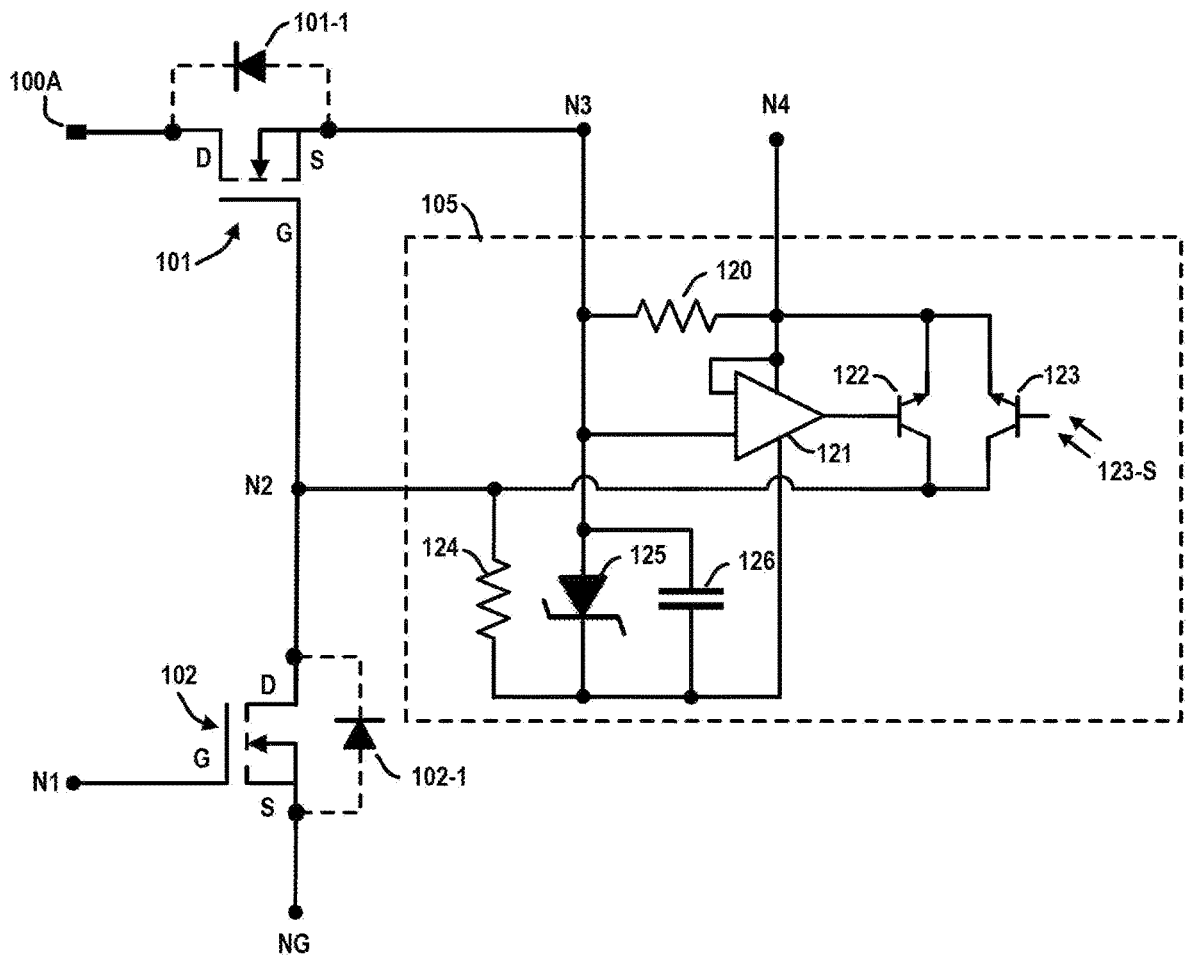
FIG. 1B schematically illustrates control circuitry of a controller which is implemented in the AC to DC converter circuit of FIG. 1A, according to an exemplary embodiment of the disclosure.

In particular, FIG. 1B schematically illustrates an exemplary embodiment of the controller 105 of the converter circuit 100 of FIG. 1A. The controller 105 comprises a sense resistor 120, an operational amplifier 121, a first control switch 122, a second control switch 123, a resistor 124, a Zener diode 125, and a capacitor 126. In some embodiments, the resistor 124, the Zener diode 125, and the capacitor 126 collectively implement self-biasing driver circuitry that is configured to utilize current from the AC power supply 10 to generate a regulated DC voltage on the second node N2 to drive the first switch 101.

Further, in some embodiments, the sense resistor 120, the operational amplifier 121, and the first control switch 122 collectively comprise a fault detection circuit of the controller 105, wherein the fault detection circuit is configured to (i) sense an amount of current flowing through the sense resistor 120, (ii) detect an occurrence of a fault condition, such as short-circuit fault, an over-current fault, etc., based on the sensed current level, and (iii) in response to detecting the fault condition, activate the first control switch 122 to shunt the control input (e.g., gate terminal) of the first switch 101 and thereby deactivate the first switch 101 and interrupt the flow of charging current to the storage capacitor 107. Moreover, in some embodiments, the second control switch 123 is utilized to implement a forced turn-off control circuit in which operation of the converter circuit 100 is deactivated in response to a control signal 123-S (e.g., optical signal) which is generated by and received from, e.g., an external control system or device.

The self-biasing driver circuitry, which is implemented by the resistor 124, the Zener diode 125, and the capacitor 126, operates as follows. During a negative half-cycle of the AC signal $V_S$, current from the AC power supply 10 flows from the ground node NG (e.g., neutral line 12) to the first input terminal 100A (coupled to the hot line 11) through the body diode 102-1 (of the second switch 102), the resistor 124, the capacitor 126, and the body diode 101-1 (of the first switch 101). In the negative half-cycle, although the first and second switches 101 and 102 do not conduct channel current (i.e., drain-to-source current), the respective body diodes 101-1 and 102-1 are forward-biased, allowing "negative" current to flow through the converter circuit 100 from the ground node NG (connected to the second input terminal 100B) to the first input terminal 100A. This current flow causes a voltage across the capacitor 126 to increase until the capacitor voltage reaches a clamping voltage (i.e., Zener voltage) of the Zener diode 125. In other words, the Zener voltage of the Zener diode 125 limits the maximum level of the self-bias DC threshold voltage ($V_{GS}$) which is generated across the second and third nodes N2 and N3 to drive the first switch 101.

In this exemplary embodiment, the maximum voltage level on the second node N2 is limited by the Zener voltage (i.e., reverse breakdown voltage) of the Zener diode 125 such that the Zener diode 125 serves as a solid-state clamp to limit the magnitude of the driving voltage on the second node N2 to drive the first switch 101. In some embodiments, the Zener diode 125 has a Zener voltage of 10V or greater. In this regard, the self-bias driving voltage is input-line voltage independent, as the level of the self-bias driving voltage is limited by the solid-state clamp. During a positive half-cycle of the input AC signal $V_S$, when the second switch 102 is not activated, the first switch 101 will be driven by the self-generated, regulated voltage on the second node N2. On the other hand, when the second switch 102 is activated during a portion of the positive half-cycle of the input AC signal $V_S$, the second node N2 is pulled down to the negative voltage level on the ground node NG, thereby deactivating the first switch 101. In this instance, while the capacitor 126 may be discharged due to current flow from the second node N2 to the ground node NG when the second switch 102 is temporarily activated, the capacitor 126 is selected to have a sufficiently large capacitance such that capacitor 126 has an amount of remaining charge and voltage level which is sufficient to drive the first switch 101 into the ON state (after the second switch 102 is deactivated) at the ending portion of the positive half-cycle of the input AC signal $V_S$. The capacitor 126 is recharged to the Zener voltage during the following negative half-cycle of the input AC signal $V_S$.

As noted above, the controller 105 comprises fault detection circuitry that is implemented by the sense resistor 120, the operational amplifier 121, and the first control switch 122. As schematically illustrated in FIG. 1B, the sense resistor 120 is serially connected between the nodes N3 and N4. In particular, the sense resistor 120 is connected between the source (S) terminal of the first switch 101 and the anode terminal of the diode 106 (FIG. 1A). The operational amplifier 121 comprises first and second input terminals (e.g., differential input terminals) which are connected to the nodes N3 and N4 across the sense resistor 120. The operational amplifier 121 comprises an output terminal that is connected to the first control switch 122. In some embodiments, the first control switch 122 comprises a bipolar junction transistor (BJT) device having a base terminal connected to the output terminal of the operational amplifier 121, an emitter terminal connected to the node N4, and a collector terminal connected to the second node N2 (i.e., connected to the gate (G) terminal of the first switch 101). The fault detection circuitry operates as follows.

During operation of the converter circuit 100, the sense resistor 120 generates a burden voltage (or sense voltage) as a result of positive current flowing from the first switch 101 to the diode 106 through the sense resistor 120. The sense voltage is applied to the differential inputs of the operational amplifier 121, and the operational amplifier 121 amplifies the sense voltage to generate an output voltage that is applied to the base terminal of the first control switch 122. When the sense voltage exceeds a value which is indicative of an excessive current flow through the sense resistor 120, the output voltage of operational amplifier 121 will reach a high enough voltage level to activate the first control switch 122 (e.g., when the base-emitter voltage $V_{BE}$ of the first control switch 122 reaches about 0.7 V). The activation of the first control switch 122 effectively shunts the gate and source terminals of the first switch 101, and thereby causes the first switch 101 to turn OFF and prevent the flow of charging current to the storage capacitor 107 (FIG. 1A).

In some embodiments, the sense resistor 120 has a very small resistance value such as on the order of 1 milliohm or less (e.g., 10× less than 1 milliohm). In this regard, the burden voltage generated across the sense resistor 120 is negligible in terms of causing minimal power dissipation, but yet sufficient for current sensing. The operational amplifier 121 is configured to have sufficient gain to be able to drive the first control switch 122, even with a relatively small voltage input corresponding to the voltage drop across the sense resistor 120. In this regard, the resistance value of the sense resistor 120 and the gain of the operational amplifier 121 are selected for a target current limit to ensure that the output of the operational amplifier 121 generates a sufficient voltage to turn on the first control switch 122 when the magnitude of current that flows through the sense resistor 120 reaches or exceeds the target current limit. In other words, the sense resistor 120 can have a relatively small resistance value (e.g., 1 milliohm) which generates a relatively small sense voltage and minimizes power dissipation for normal circuit operation, but which is amplified by the operational amplifier 121 to enable over-current detection using the small sense voltage. Moreover, the resistance value of the sense resistor 120 can remain fixed (e.g., 1 milliohm) while the gain of the operational amplifier 121 is adjusted as desired to adjust the target current level for over-current and short circuit detection.

Furthermore, in some embodiments, as noted above, the controller 105 utilizes the second control switch 123 to implement a forced turn-off control circuit which is configured to deactivate operation of the converter circuit 100 in response to the control signal 123-S received from, e.g., an external control system or device. In particular, activation of the second control switch 123 (by the control signal 318-S) serves to shunt the gate and source terminals of the first switch 101, and thereby cause the first switch 101 to turn OFF and prevent the flow of charging current to the storage capacitor 107 (FIG. 1A). In some embodiments, the second control switch 123 comprises a phototransistor (e.g., an optical BJT device which includes a photodiode junction) or other types of optically controlled switches which receive optical signals from complementary light emitting diodes (LED) that are controlled by, e.g., a sensor device or a microcontroller. The control signal 123-S can be generated in response to remote commands (e.g., alarm signals) received from a local or a remote controller that is configured to detect fault conditions, or in response to remote commands received from an individual who can control operation of the converter circuit 100 through smart technologies implemented using, for example, an Internet-of-Things (IoT) wireless computing network, wherein the converter circuit 100 comprises a smart wireless IoT device.

In some embodiments, the control signal 123-S is generated in response to the detection of hazardous environmental conditions by one or more sensors that are configured to sense environmental conditions. For example, such sensors can include one or more of (i) a chemical sensitive detector that is configured to detect the presence of hazardous chemicals, (ii) a gas sensitive detector that is configured to detect the presence of hazardous gases, (iii) a temperature sensor that is configured to detect high temperatures indicative of, e.g., a fire, (iv) a piezoelectric detector that is configured to detect large vibrations associated with, e.g., explosions, earthquakes, etc., (v) a humidity sensor or water sensor that is configured to detect floods or damp conditions, and other types of sensors that are configured to detect for the presence or occurrence of hazardous environmental conditions that would warrant DC power interruption to the load 20.

Figure 1C:
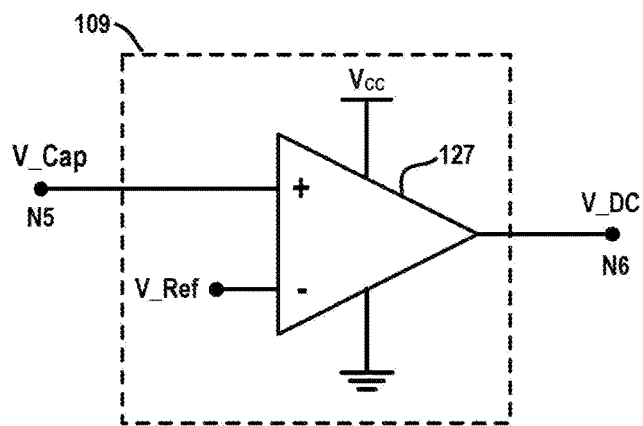
FIG. 1C schematically illustrates a voltage regulator circuit which is implemented in the AC to DC converter circuit of FIG. 1A, according to an exemplary embodiment of the disclosure.

In some embodiments, the control signal 123-S comprises ambient light that is sensed by the second control switch 123 which operates as a light sensor when implemented as a phototransistor. In this instance, the converter circuit 100 can be a component of an electrical light switch device which drives a DC lighting element (e.g., DC LED lighting) such that when the intensity of the ambient light (e.g., intensity of the optical signal 123-S) reaches a certain level, the second control switch 123 is activated to turn off the first switch 101 and an interrupt DC power that is delivered to the DC lighting element. In some embodiments, the optical coupling between the second control switch 123 and the external control system (which controls the generation of the control signal 123-S) essentially provides galvanic isolation between the converter circuit 100 and the external control system. In other embodiments, galvanic isolation between the second control switch 123 and the external control system can be implemented using magnetic, capacitive, or radio frequency (RF) isolation technologies The voltage regulator circuit 109 of FIG. 1A and can implemented using any suitable voltage regulation circuitry that is configured to generate a regulated DC voltage (V_DC) on the output node N6 based on the capacitor voltage (V_Cap) on the node N5. For example, FIG. 1C schematically illustrates an exemplary embodiment of the voltage regulator circuit 109, which can be implemented in the converter circuit 100 of FIG. 1A. The voltage regulator circuit 109 of FIG. 1C comprises a voltage comparator 127 which is configured as a positive voltage comparator circuit (or non-inverting comparator circuit). In particular, the voltage comparator 127 is configured to compare an input voltage (V_Cap) to a reference voltage (V_Ref), and generate (i) a V_DC output voltage (e.g., $V_{CC}$ rail voltage) when V_Cap is greater than V_Ref, or (ii) a zero (0) voltage (e.g., ground rail voltage) when V_Cap is less than V_Ref. It is to be understood that the voltage regulator circuit 109 can be implemented using other types of voltage regulation circuits and techniques which are suitable to implement the functions of the converter circuit 100 as discussed herein.

FIGS. 2A, 2B, and 2C depict exemplary waveform diagrams which illustrate an exemplary mode of operation of the AC to DC converter circuit of FIG. 1A, according to an exemplary embodiment of the disclosure. In particular, FIG. 2A illustrates an exemplary AC voltage waveform 200 which is generated by the AC power supply 10 and applied to the first and second input terminals 100A and 100B of the converter circuit 100 of FIG. 1A. As noted above, in some embodiments, the AC voltage waveform 200 has a frequency of 60 Hz and a voltage of 120V RMS (a peak value of about 170V), although in other embodiments, the AC voltage waveform 200 can have other peak voltage levels and/or frequencies. Moreover, FIG. 2B illustrates an exemplary capacitor voltage waveform 210 which represents a capacitor voltage (V_Cap) of the storage capacitor 107 that is generated on the fifth node N5 at the input to the voltage regulator circuit 109. Further, FIG. 2C illustrates an exemplary regulated DC output voltage waveform 220 (V_DC) which is generated at the output (node N6) of the voltage regulator circuit 109 based on the exemplary capacitor voltage waveform 210 of FIG. 2B.

For illustrative purposes, FIGS. 2A, 2B, and 2C illustrate specific points in time (e.g., t0, t1, t2, t3, t4, and t5) of the input AC voltage waveform 200, to explain different operating states of the converter circuit 100 of FIG. 1A. In particular, during portions t0-t1, t2-t3, and t4-t5 (beginning and ending portions) of the positive half-cycles of the input AC voltage waveform 200, it is assumed that the gate voltage $V_G$ generated on the node N1 of the resistive voltage divider circuit is less than the threshold voltage of the second switch 102, such that the second switch 102 is in an OFF state, while the first switch 101 is in an ON state, thereby allowing current to flow to charge the storage capacitor 107. Accordingly, as shown in FIG. 2B, the capacitor voltage waveform 210 is shown to increase during the portions t0-t1, t2-t3, and t4-t5 of the positive half-cycles of the input AC voltage waveform 200 as a result of the charging current flowing to the storage capacitor 107.

On the other hand, during a middle portion t1-t2 (denoted "Extraction" period) of the positive half-cycle of the input AC voltage waveform 200, it is assumed that the gate voltage $V_G$ generated on the node N1 of the resistive voltage divider circuit is greater than or equal to the threshold voltage of the second switch 102. In this instance, the second switch 102 is in an ON state, which causes the first switch 101 to be in an OFF state so that no positive current flows through the first switch 101 to the storage capacitor 107. In this instance, the storage capacitor 107 is no longer being charged, but rather becomes a DC voltage source to drive the input of the voltage regulator circuit 109. Accordingly, as shown in FIG. 2B, the capacitor voltage waveform 210 is shown to decrease during the middle portion t1-t2 (with the peak voltage level) of the positive half-cycle of the input AC voltage waveform 200 as a result of the discharging of the storage capacitor 107 operating as a DC voltage source to drive the input of the voltage regulator circuit 109.

Furthermore, during the entirety (e.g., from t3 to t4) of the negative half-cycle of the input AC voltage waveform 200, second switch 102 is in an OFF state, and the diode 106 is in a reverse-biased state which prevents discharging current to flow from the storage capacitor 107 to the AC power supply 10 through the forward-biased body diode 101-1 of the first switch 101. In this instance, the storage capacitor 107 will not be discharged by negative input AC voltage signal during the negative half-cycle of input AC voltage waveform 200. On the other hand, the capacitor voltage of the storage capacitor 107 can slightly decrease due to discharging of the storage capacitor 107 operating as a DC voltage source to drive the input of the voltage regulator circuit 109. Accordingly, as shown in FIG. 2B, the capacitor voltage waveform 210 is shown to slightly decrease during the entire negative half-cycle of the input AC voltage waveform 200 as a result of the discharging of the storage capacitor 107 operating as a DC voltage source to drive the input of the voltage regulator circuit 109.

As further shown in FIG. 2B, while the exemplary capacitor voltage waveform 210 increases and decreases over time, the magnitude of the capacitor voltage V_Cap remains greater than a reference voltage V_Ref of the voltage regulator circuit 109. Therefore, as shown in FIG. 2C, a regulated DC output voltage (V_DC) generated by the voltage regulator circuit 109 remains at a constant V+ level. In some embodiments, the reference voltage V_Ref and the capacitance of the storage capacitor 107 are selected such that during normal operation of the converter circuit 100, the capacitor voltage V_Cap will remain above V_Ref over each full cycle of the input AC voltage waveform 200, despite the "Extraction" periods in which the storage capacitor 107 is discharged when operating as a DC voltage source to drive the input of the voltage regulator circuit 109. As noted above, with this exemplary configuration, only a portion of each positive half-cycle of the input AC voltage waveform 200 is "sampled" to supply the charging current to the storage capacitor 107, while the stored charge on the storage capacitor 107 is utilized in other portions of the input AC voltage waveform 200 to drive the input of the voltage regulator circuit 109 to maintain a constant regulated DC voltage level V_DC on the output terminal 100C of the converter circuit 100. Advantageously, the operation of the control circuitry 110 is configured to conserve electrical energy by significantly reducing the utilization of the AC power for the AC to DC signal conversion to generate the regulated DC voltage V_DC.

Figure 3:
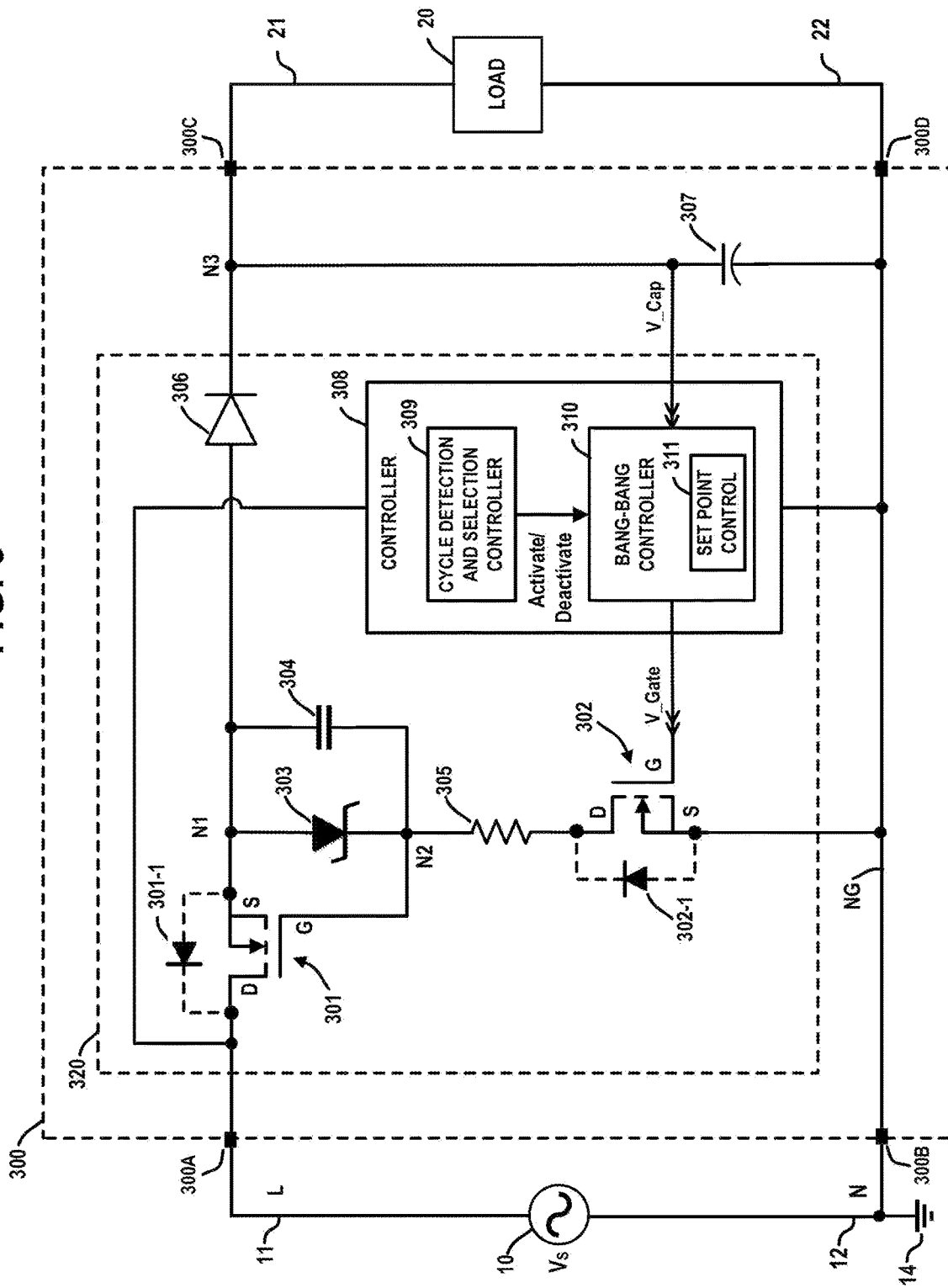
FIG. 3 schematically illustrates an AC to DC converter circuit, according to another exemplary embodiment of the disclosure.

FIG. 3 schematically illustrates an AC to DC converter circuit, according to another exemplary embodiment of the disclosure. In particular, FIG. 3 schematically illustrates a converter circuit 300 which is connected between an AC power supply 10 and a load 20, similar to the exemplary embodiment of shown in FIG. 1A. The converter circuit 300 comprises a first input terminal 300A, a second input terminal 300B, a first output terminal 300C, and a second output terminal 300D. The first and second input terminals 300A and 300B are coupled to the hot phase 11 and the neutral phase 12, respectively, of the AC power supply 10. The first and second output terminals 300C and 300D are coupled to the positive DC input 21 and the negative DC input 22, respectively, of the load 20.

The converter circuit 300 comprises a first solid-state switch 301, a second solid-state switch 302, a Zener diode 303, a first capacitor 304, a resistor 305, a second capacitor 307 (alternatively, storage capacitor 307), and a controller 308. The controller 308 comprises a cycle detection and selection controller 309, and a bang-bang controller 310. The bang-bang controller 310 comprises a programmable set point controller 311. In some embodiments, the controller 308 comprises a microprocessor, a microcontroller, an ASIC, an FPGA, or other type of programmable device, which is configured to implement control functions of the controller 308 as described herein.

In some embodiments, the first and second solid-state switches 301 and 302, the Zener diode 303, the first capacitor 304, the resistor 305, and the controller 308 collectively implement control circuitry 320 of the converter circuit 300. As explained in further detail below, the control circuitry 320 is configured to (i) monitor a voltage level (capacitor voltage V_Cap) across the storage capacitor 307 during a positive half-cycle of the input AC signal $V_S$ to determine whether the voltage level is greater than or less than a threshold voltage, (ii) couple the first input terminal 300A of the converter circuit 100 to the storage capacitor 307 to thereby charge the storage capacitor 307 during the positive half-cycle, in response to determining that the voltage level across the storage capacitor 307 is less than the threshold voltage, (iii) decouple the first input terminal 300A of the converter circuit 100 from the storage capacitor 307 during the positive half-cycle, in response to determining that the voltage level across the storage capacitor 307 is greater than the threshold voltage, and (iv) decouple the first input terminal 300A of the converter circuit 100 from the storage capacitor 307 during an entirety of each negative half-cycle of the input AC signal $V_S$, to thereby prevent discharging of the storage capacitor 307 by the input AC signal $V_S$.

The control circuitry 320 is configured to control the charging and discharging of the storage capacitor 307 in a way which minimizes the voltage swing (ΔV) on the output terminal 300C, and thereby maintains the capacitor voltage V_Cap at a relatively constant voltage level. With the exemplary embodiment of the converter circuit 300 of FIG. 3, the storage capacitor 307 is configured for use as DC power source for the converter circuit 300 to output DC power to the load 20, which is coupled to the output terminals 300C and 300D of the converter circuit 300. In particular, the capacitor voltage V_Cap of the storage capacitor 307 comprises a DC voltage (V_DC) that is output from the converter circuit 300. By minimizing the voltage swing (ΔV) on the output node 300C, no additional voltage regulator circuitry is needed at the output of the converter circuit 300 to output a regulated DC voltage to the load 20.

In some embodiments, the first and second solid-state switches 301 and 302 comprise power MOSFET devices and, in particular, N-type enhancement MOSFET devices having gate (G) terminals, drain (D) terminals, and source (S) terminals, as shown. The first and second solid-state switches 301 and 302 (alternatively first and second switches 301 and 302) comprise respective intrinsic body diodes 301-1 and 302-1, which represent P-N junctions between a P-type substrate body and N-doped drain regions of the respective first and second solid-state switches 301 and 302. The first switch 301 has a drain (D) terminal coupled to the first input terminal 300A, a source (S) terminal coupled to a first node N1, and a gate (G) terminal coupled to a second node N2. The Zener diode 303 and the first capacitor 304 are connected in parallel between the first and second nodes N1 and N2. The Zener diode 303 comprises an anode terminal coupled to the first node N1, and a cathode terminal is coupled to the second node N2. The first resistor 305 has a first terminal coupled to the second node N2, and a second terminal coupled to a drain (D) of the second switch 302.

The second switch 302 comprises a gate (G) terminal coupled to an output of the bang-bang controller 310, and a source (S) terminal coupled to a ground node NG. The diode 306 comprises an anode terminal coupled to the first node N1, and a cathode terminal coupled to a third node N3. The storage capacitor 307 comprises a first terminal coupled to the third node N3, and a second terminal coupled to the ground node NG. The bang-bang controller 310 comprises an input coupled to the third node N3. In the exemplary embodiment of FIG. 3, the second input terminal 300B and the second output terminal 300D are commonly connected to the ground node NG of the converter circuit 300 such that the ground node NG essentially comprises the second input terminal 300B and the second output terminal 300D.

The controller 308 is coupled to the first input terminal 300A and to the second input terminal 300B. The bang-bang controller 310 is configured to monitor the capacitor voltage V_Cap across the storage capacitor 307, compare the capacitor voltage V_Cap to a programmed voltage set point (V_SET), and generate a control voltage V_Gate to activate or deactivate the second switch 302, depending on whether the capacitor voltage V_Cap is determined to be greater than or less than V_SET. In some embodiments, the value of V_SET can be programmatically set by operation of the set point controller 312. In some embodiments, the bang-bang controller 310 is implemented using a window detector circuit, or a window comparator circuit, or a dual edge limit detector circuit, which utilizes two comparators to detect over-voltage or under-voltage conditions. One of ordinary skill in the art can readily implement any suitable type of bang-bang controller 310 to realize the functionalities and operational modes of the converter circuit 300 as described herein.

The cycle detection and selection controller 309 comprises a zero-crossing detector which monitors the input AC signal $V_S$ (which is applied to the first and second input terminals 300A and 300B) to detect zero voltage crossings of the input AC signal $V_S$. In this configuration, the cycle detection and selection controller 309 is configured to detect positive and negative half-cycles of the input AC signal $V_S$, as well as detect the transition direction (e.g., transitioning from a negative half-cycle to a positive half-cycle, or from a positive half-cycle to a negative half-cycle). The cycle detection and selection controller 309 is configured to generate a control signal to control operation (e.g., activation and deactivation) of the bang-bang controller 310. For instance, in some embodiments, the cycle detection and selection controller 309 will generate a control signal to (i) activate the operation of the bang-bang controller 310 when the input AC signal $V_S$ is detected to be transitioning to a positive half-cycle, or to (ii) deactivate the operation of the bang-bang controller 310 when the input AC signal $V_S$ is detected to be transitioning to a negative half-cycle. In this regard, in some embodiments, the bang-bang controller 310 will operate during positive half-cycles of the input AC signal $V_S$, and be deactivated during negative half-cycles of the input AC signal $V_S$.

In some embodiments, the cycle detection and selection controller 309 is configured to detect the phase of the positive half-cycle of the input AC signal $V_S$ (e.g., 45 degree, 90 degree, etc.) to provide finer control over the activation and deactivation of the bang-bang controller 310. For example, in some embodiments, the cycle detection and selection controller 309 is configured to activate the bang-bang controller 310 during the beginning portion of each positive half-cycle (e.g., 0°-45°, 0°-60°, 0°-90°, etc.). In this regard, the bang-bang controller 310 will operate during the beginning portion of each positive half-cycle of the input AC signal $V_S$, and be deactivated during the remaining portion of each positive half-cycle of the input AC signal $V_S$, as well as the entirety of each negative half-cycle of the input AC signal $V_S$.

Similar to the exemplary embodiment of FIG. 1B, the converter circuit 300 comprises a self-biasing driver circuit, which is implemented by the Zener diode 303, the capacitor 304, and the resistor 305, to self-generate a regulated gate voltage on the second node N2 to drive the first switch 301. During a negative half-cycle of the AC signal $V_S$, current flows from the second input terminal 300B (ground node NG) to the first input terminal 300A through the electrical path comprising the forward-biased body diode 302-1 of the second switch 302, the resistor 305, the capacitor 304, and forward-biased body diode 301-1 of the first switch 301. This current flow causes a voltage across the capacitor 304 to increase until the capacitor voltage reaches the Zener voltage of the Zener diode 303. The Zener voltage (e.g., 10V or greater) provides a positive $V_{GS}$ to drive the first switch 301 during a next positive half-cycle of the AC signal $V_S$ when the control circuitry 320 operates to charge the storage capacitor 307.

A more detailed explanation of the operation of the converter circuit 300 will now be provided. In operation, the control circuitry 320 is configured to monitor the capacitor voltage V_Cap across the storage capacitor 307 during a positive half-cycle of the input AC signal $V_S$ and charge the storage capacitor 307 when the capacitor voltage V_Cap is determined to be less than a voltage threshold level V_SET. More specifically, during a positive half-cycle of the input AC signal $V_S$, when the bang-bang controller 310 detects that the capacitor voltage V_Cap is less than V_SET, the bang-bang controller 310 outputs a control signal V_Gate having a logic "0" level, which keeps the second switch 302 turned OFF. In this instance, the first switch 301 is activated (via the self-generated regulated drive voltage on node N2), and a positive current flows from the input terminal 300A and through the first switch 301 and the forward-biased diode 306 to charge the storage capacitor 307 and thereby increase the level of the capacitor voltage V_Cap.

On the other hand, during a positive half-cycle of the input AC signal $V_S$, when the bang-bang controller 310 detects that the capacitor voltage V_Cap is greater than V_SET, the bang-bang controller 310 outputs a control signal V_Gate having a logic "1" level, which causes the second switch 302 to turn ON. When the second switch 302 is turned ON during the positive half-cycle of the input AC signal $V_S$, the gate (G) terminal of the first switch 301 is pulled down to the ground node NG, which causes the first switch 301 to turn OFF. When the first switch 301 is turned OFF, no charging current flows from the AC power supply 10 to the storage capacitor 307. Instead, the storage capacitor 107 operates as a DC power source to supply DC power to the load 20. Over time, the storage capacitor 307 will slowly discharge to a point where the capacitor voltage V_Cap falls below the voltage threshold V_SET. In this instance, the control circuitry 320 will charge the storage capacitor 307 to at least the V_SET level starting at the beginning of a next positive half-cycle of the input AC signal $V_S$.

On the other hand, during a negative half-cycle the input AC signal $V_S$, the diode 306 is reverse-biased, which prevents discharging of the storage capacitor 307 to the AC power supply 10 due to the negative phase of the AC signal $V_S$. In some embodiments, the bang-bang controller 310 is deactivated during the negative half-cycles of the input AC signal $V_S$. As such, the V_Gate voltage will be set to a logic "0" level, irrespective of the level of the capacitor voltage V_Cap. However, when the input AC signal $V_S$ transitions from the negative half-cycle to the next positive half-cycle, the bang-bang controller 310 is activated by the cycle detection and selection controller 309 and, upon activation, the bang-bang controller 310 will compare the level of the capacitor voltage V_Cap with V_SET. If V_Cap is determined to be less than V_SET, the bang-bang controller 310 will maintain the V_Gate voltage at the logic "0" level, so that the second switch 302 remains OFF and the first switch 301 remains ON to thereby allow charging current to flow to the storage capacitor 307. On the other hand, if V_Cap is determined to be greater than V_SET, the bang-bang controller 310 will output a control voltage V_Gate at a logic "1" level, so that the second switch 302 is turned ON, and the first switch 301 is turned OFF, to thereby prevent charging current to flow to the storage capacitor 307. An exemplary mode of operation of the converter circuit 300 will be discussed in further detail below in conjunction with the exemplary waveform diagrams of FIGS. 4A, 4B, and 4C.

Figure 4:
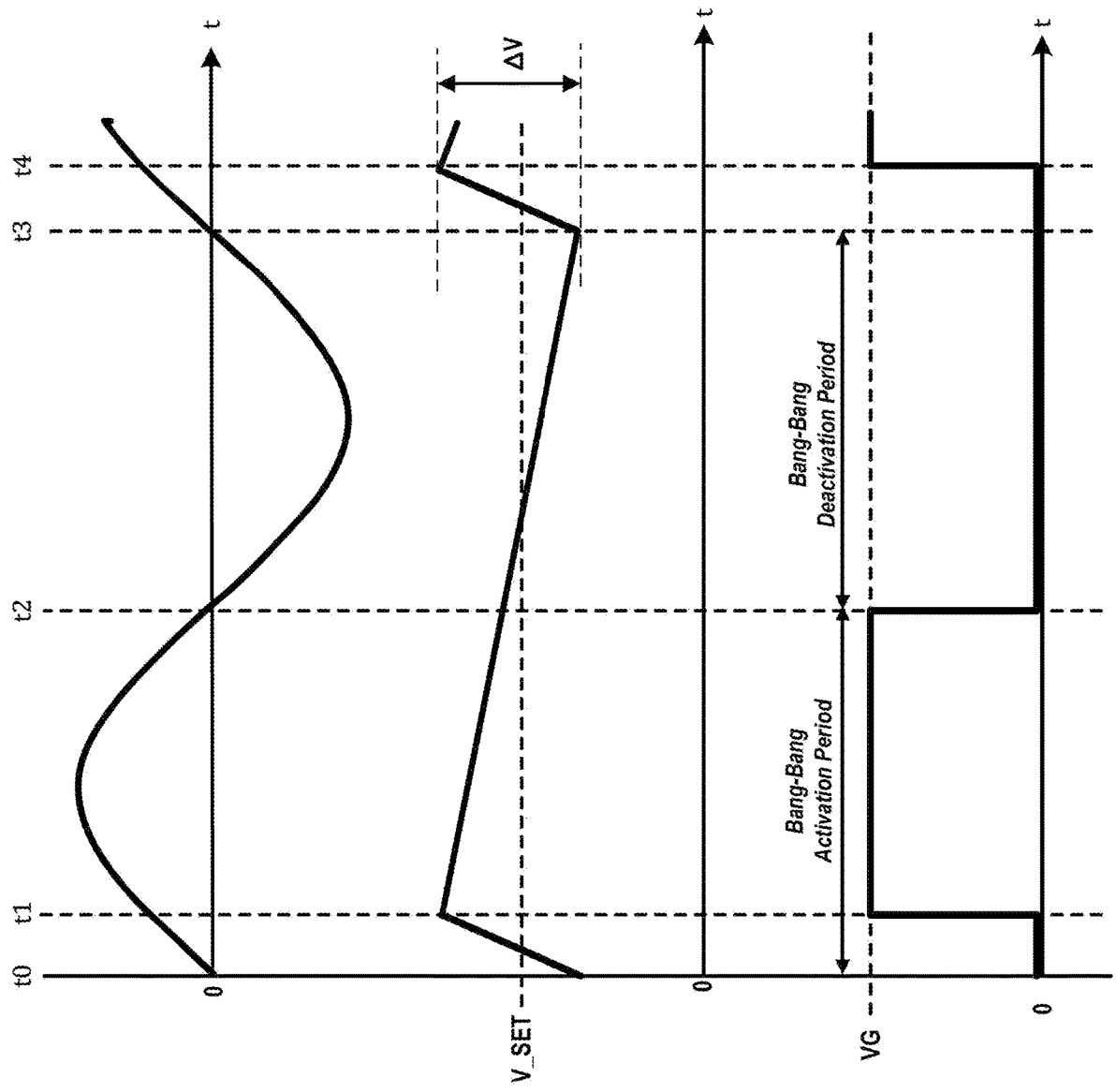
FIGS. 4A, 4B, and 4C depict exemplary waveforms diagrams which illustrate an exemplary mode of operation of the AC to DC converter circuit of FIG. 3, according to an exemplary embodiment of the disclosure.

FIGS. 4A, 4B, and 4C depict exemplary waveforms diagrams which illustrate an exemplary mode of operation of the AC to DC converter circuit of FIG. 3, according to an exemplary embodiment of the disclosure. In particular, FIG. 4A illustrates an exemplary AC voltage waveform 400 which is generated by the AC power supply 10 and applied to the first and second input terminals 300A and 300B of the converter circuit 300 of FIG. 3. As noted above, in some embodiments, the AC voltage waveform 400 has a frequency of 60 Hz and a voltage of 120V RMS (a peak value of about 170V), although in other embodiments, the AC voltage waveform 400 can have other peak voltage levels and/or frequencies. Moreover, FIG. 4B illustrates an exemplary capacitor voltage waveform 410 which represents a capacitor voltage (V_Cap) of the storage capacitor 307 on the output node (e.g., node N3) of the converter circuit 300. Further, FIG. 4C illustrates an exemplary control signal waveform (V_Gate) 420 that is generated by the bang-bang controller 310 to control operation of the second switch 302.

For illustrative purposes, FIGS. 4A, 4B, and 4C illustrate different points in time t0, t1, t2, t3, and t4 of the input AC voltage waveform 400 to explain different operating states of the converter circuit 300 of FIG. 3. Moreover, for illustrative purposes, the waveform diagrams of FIGS. 4B and 4C assume that the bang-bang controller 310 is activated during an entirety of each positive half-cycle of the input AC voltage waveform 400 (denoted Bang-Bang Activation Period), and deactivated during an entirety of each negative half-cycle of the input AC voltage waveform 400 (denoted Bang-Bang Deactivation Period). In particular, at the beginning of the positive half-cycle of the input AC voltage waveform 400 (i.e., at time t0), as shown in FIG. 4B, the capacitor voltage V_Cap is less than a voltage threshold level V_SET. In this instance, as shown in FIG. 4C, the bang-bang controller 310 outputs a control voltage V_Gate having a zero (0) voltage level, which causes the second switch 302 to be in an OFF state, and allows the first switch 301 to be turned ON to allow charging current to flow to the storage capacitor 307. In some embodiments, assuming that the input AC voltage waveform 400 has a voltage of 120V RMS (peak voltage of 170 V), the threshold voltage V_SET can be in a range of about 40V to about 60V, depending on the required DC voltage level needed to drive the given load 20.

As shown in FIG. 4B, during the time period from t0-t1, the capacitor voltage V_Cap charges to a level that exceeds the voltage threshold V_SET. Once the capacitor voltage V_Cap exceeds V_SET, after some short delay time needed for the bang-bang controller 310 to compare V_Cap and V_SET, and transition the level of the control voltage (a hysteresis or lag in response to change), the bang-bang controller 310 outputs, at time t1, a control voltage V_Gate having a VG voltage level. The VG voltage level is sufficient to cause the second switch 302 to turn ON which, in turn, causes the first switch 301 to turn OFF and thereby stop the flow of charging current to the storage capacitor 307 (e.g., decouple the third node N3 from the input terminal 300A).

Over time, the capacitor voltage V_Cap will slowly decrease due to discharging of the storage capacitor 307 operating as a DC power source to drive the load 20. For example, as shown in FIG. 4B, the control voltage V_Gate remains at the VG voltage level for the remainder of the positive half-cycle (from time t1 to t2), since the slowly decreasing capacitor voltage V_Cap does not drop below the voltage threshold V_SET during such time. When the AC voltage waveform 400 transitions to the negative half-cycle at time t2, the bang-bang controller 310 is deactivated, and the control voltage V_Gate transitions from the VG level to the zero (0) level. Although FIG. 4B shows the capacitor voltage V_Cap falling below the voltage threshold V_SET at some point in time during the negative half-cycle (between times t2 and t3), as explained above, the storage capacitor 307 is not charged during the negative half-cycles of input AC voltage waveform 400. As such, the capacitor voltage V_Cap continues to slowly decrease during the negative half-cycle until the next positive half-cycle begins at time t3.

In particular, as shown in FIGS. 4B and 4C, at time t3 (beginning of the next positive half-cycle), the bang-bang controller 310 is activated, and detects that the capacitor voltage V_Cap is below the threshold voltage V_SET. In response, the bang-bang controller 310 maintains the control voltage V_Gate at the zero (0) level, to keep the second switch 302 in an OFF state, and allow charging current to flow through the first switch 301 and the forward-biased diode 306 to begin charging the storage capacitor 307 at time t3. As the storage capacitor 307 is charged, the capacitor voltage V_Cap increases (during the time period from t3 to t4) to a level that exceeds the voltage threshold V_SET, which causes the bang-bang controller 310 to transition (at time t4) the control voltage V_Gate to the VG voltage level. As noted above, the VG voltage level applied to the gate (G) terminal of the second switch 302 causes the second switch 302 to turn ON which, in turn, causes the first switch 301 to turn OFF and thereby stop the flow of charging current to the storage capacitor 307.

As shown in FIG. 4B, the capacitor voltage V_Cap will fluctuate with a differential voltage ΔV about the threshold voltage level V_SET. In some embodiments, the converter circuit 300 is configured to minimize the magnitude of ΔV as well as minimize the discharge rate of the storage capacitor 307. For example, FIG. 4B shows an exemplary embodiment in which the capacitor voltage V_Cap decreases to a level below the threshold voltage V_SET over one cycle (positive and negative half-cycles) of the input AC voltage waveform 400, i.e., ΔV spans one cycle of the input AC voltage waveform 400. In other embodiments, the converter circuit 300 of FIG. 3 is configured such that ΔV spans two or more cycles of the input AC voltage waveform 400. For example, in the exemplary embodiment of FIG. 4B, starting at time t1, the capacitor voltage V_Cap may have a slow discharge rate such that the positive half-cycle starting at time t3 may actually be the starting time of a second or third positive half-cycle of the AC voltage waveform 400 following the positive half-cycle which starts at time t0.

In this regard, in some embodiments, a capacitance value C of the storage capacitor 307 is selected to be sufficiently large such that the discharge rate of the storage capacitor 307 results in low rate of voltage decrease −dV/dt of the capacitor voltage V_Cap. As is known in the art, the value of dV/dt, multiplied by the capacitance C (in Farads) of the storage capacitor 307 results in a discharge current I of a given magnitude, i.e., $$I = C\frac{dV}{dt} \text{ or } \Delta V = \frac{Idt}{C}.$$

These equations illustrate that for a given discharge current I (which is anticipated based on the given load 20 that is driven by the storage capacitor 307), an increase in the value of C decreases the value of ΔV. In some embodiments, the storage capacitor 307 has a capacitance in a range of about 33 microfarads to about 100 microfarads.

Figure 5:
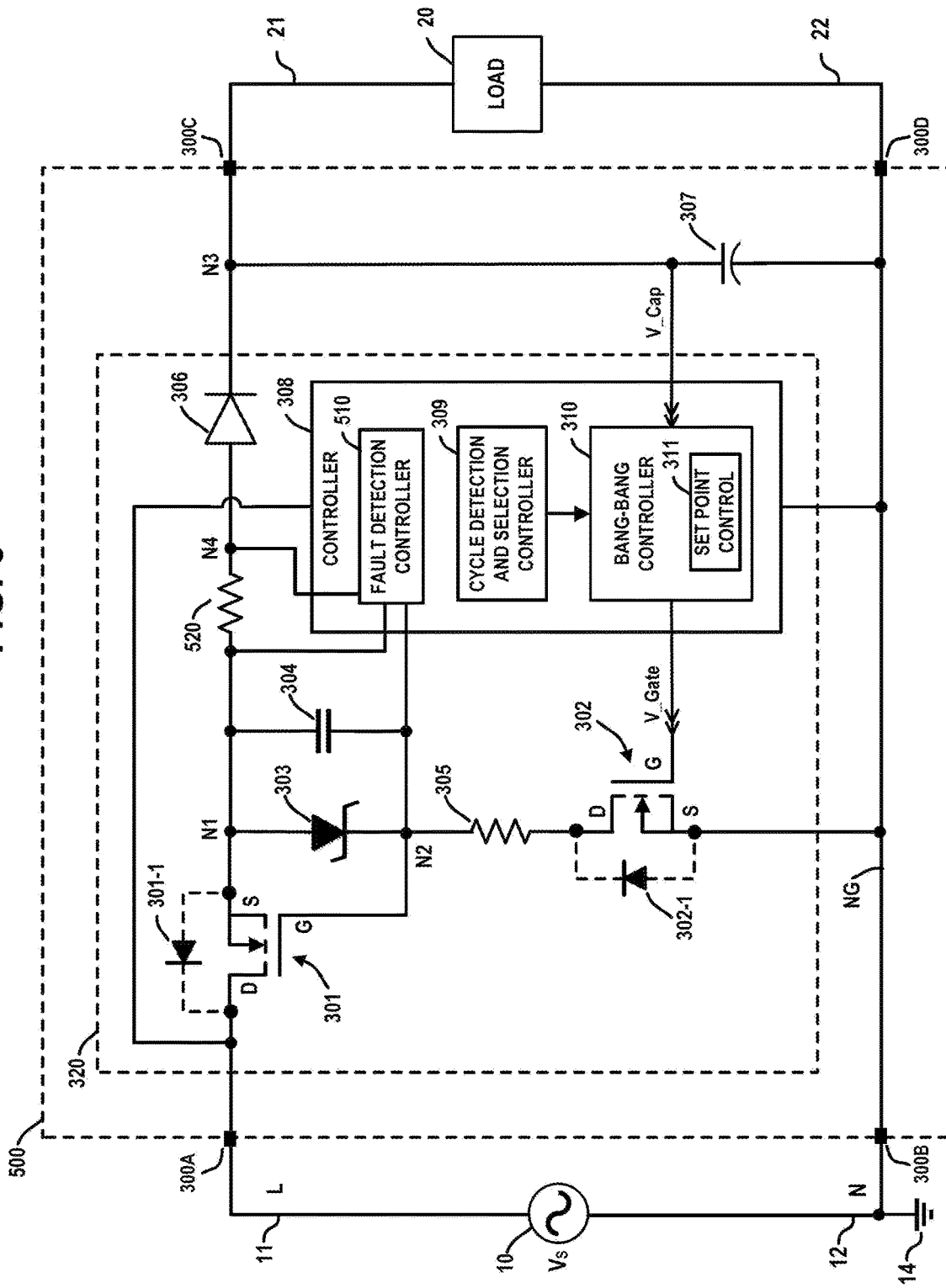
FIG. 5 schematically illustrates an AC to DC converter circuit, according to another exemplary embodiment of the disclosure.

FIG. 5 schematically illustrates an AC to DC converter circuit, according to another exemplary embodiment of the disclosure. In particular, FIG. 5 schematically illustrates a converter circuit 500 which is similar in circuit configuration and operation as the converter circuit 300 of FIG. 3, expect that the controller 308 in FIG. 5 implements a fault detection controller 510, and the control circuitry 320 further comprises a sense resistor 520 connected between the first node N1 and a fourth node N4. The fault detection controller 510 is configured to sense an amount of current flowing through the sense resistor 520 to detect for an occurrence of a fault condition, such as short-circuit fault, an over-current fault, etc., based on the sensed current level. In response to detecting a fault condition, the fault detection controller 510 is configured to shunt the gate and source terminals of the first switch 301, and thereby cause the first switch 301 to turn OFF and prevent the flow of charging current to the storage capacitor 307. In some embodiments, the fault detection controller 510 implements control circuitry which is the same or similar to the fault detection circuitry discussed above in conjunction with the exemplary embodiment of FIG. 1B.

The exemplary embodiments shown in FIGS. 1A, 1B, 1C, 3 and 5 include novel architectures for implementing an AC to DC converter circuit or device, which can be disposed between an input AC power source and a load that operates on DC power. While the exemplary AC to DC converters are generically depicted as connecting an AC power supply 10 to a load 20, it is to be understood that the exemplary AC to DC converters can be embodied in various devices and applications. For example, in some embodiments, the AC to DC converters shown in FIGS. 1A, 3 and 5 can be implemented in an electrical receptacle device, or an electrical light switch (e.g., a wall-mounted light switch or a light switch implemented in a smart light fixture or smart ceiling light bulb socket, etc.) to provide DC power to loads that operate on DC power. In other embodiments, the AC to DC converters shown in FIGS. 1A, 3 and 5 may comprise standalone devices that are disposed within a gang box in an electrical network of a home or building and configured to provide DC power to devices, loads, that are connected in a branch circuit downstream of the standalone AC to DC converter device. In other embodiments, the AC to DC converters shown in FIGS. 1A, 3 and 5 may be integrated with electrical devices (e.g., LED lighting) to generate the DC power needed to operate the electrical devices.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A converter circuit, comprising:
    a first input terminal and a second input terminal, which are configured for connection to an alternating current (AC) power supply to receive as input an AC signal;
    control circuitry coupled to the first and second input terminals and configured to receive as input positive and negative half-cycles of the AC signal; and
    a storage capacitor comprising a first terminal coupled to an output node of the control circuitry, wherein the storage capacitor is charged by the control circuitry and configured for use as a direct current (DC) power source of the converter circuit;
    wherein the control circuitry comprises switching circuitry which is configured to (i) couple the first input terminal of the converter circuit to the first terminal of the storage capacitor during a portion of a positive half-cycle of the input AC signal, which is less than an entirety of the positive half-cycle of the input AC signal, to thereby charge the storage capacitor during the portion of the positive half-cycle of the input AC signal, and (ii) decouple the first input terminal of the converter circuit from the first terminal of the storage capacitor during an entirety of each negative half-cycle of the input AC signal, to thereby prevent discharging of the storage capacitor by the input AC signal.

2. The converter circuit of claim 1, wherein the storage capacitor is configured for use as DC power source of the converter circuit to output DC power to a load when coupled to an output terminal of the converter circuit.

3. The converter circuit of claim 1, wherein the converter circuit comprises a voltage regulator circuit configured to generate a regulated DC voltage on an output terminal of the converter circuit, and wherein the storage capacitor is configured for use as DC voltage source to drive an input of the voltage regulator circuit.

4. The converter circuit of claim 1, wherein:
the control circuitry comprises a diode having a cathode coupled to the first terminal of the storage capacitor;
the diode is configured to be forward-biased during each positive half-cycle of the input AC signal to allow current to flow to charge the storage capacitor;
the diode is configured to be reverse-biased during each negative half-cycle of the input AC signal to prevent discharging of the storage capacitor by the input AC signal.

5. The converter circuit of claim 1, wherein the control circuitry is configured to:
monitor a voltage level across the storage capacitor during the positive half-cycle of the input AC signal to determine whether the voltage level is greater than or less than a threshold voltage;
control the switching circuitry to couple the first input terminal of the converter circuit to the first terminal of the storage capacitor to thereby charge the storage capacitor during the positive half-cycle of the input AC signal, in response to determining that the voltage level across the storage capacitor is less than the threshold voltage; and
control the switching circuitry to decouple the first input terminal of the converter circuit from the first terminal of the storage capacitor during the positive half-cycle of the input AC signal, in response to determining that the voltage level across the storage capacitor is greater than the threshold voltage.

6. The converter circuit of claim 1, wherein:
the switching circuitry comprises:
a first transistor; and
a second transistor coupled to a gate terminal of the first transistor;
the first transistor is configured for activation during the portion of the positive half-cycle of the input AC signal to allow a flow of current to the storage capacitor to charge the storage capacitor; and
the second transistor is configured for activation during a remaining portion of the positive half-cycle of the input AC signal to thereby deactivate the first transistor and stop the flow of current to the storage capacitor.

7. The converter circuit of claim 6, further comprising a driver circuit configured to generate a regulated DC voltage using current drawn from the AC power supply during each negative half-cycle of the input AC signal, wherein the regulated DC voltage is utilized to drive the first transistor during the portion of the positive half-cycle of the input AC signal when the second transistor is deactivated.

8. A converter circuit, comprising:
a first input terminal and a second input terminal, which are configured for connection to an alternating current (AC) power supply to receive as input an AC signal;
control circuitry coupled to the first and second input terminals and configured to receive as input positive and negative half-cycles of the AC signal; and
a storage capacitor comprising a first terminal coupled to an output node of the control circuitry, wherein the storage capacitor is charged by the control circuitry and configured for use as a direct current (DC) power source of the converter circuit to output DC power to a load that is coupled to an output terminal of the converter circuit;
wherein the control circuitry is configured to:
monitor a voltage level across the storage capacitor during a positive half-cycle of the input AC signal to determine whether the voltage level is greater than or less than a threshold voltage;
couple the first input terminal of the converter circuit to the first terminal of the storage capacitor to thereby charge the storage capacitor during the positive half-cycle, in response to determining that the voltage level across the storage capacitor is less than the threshold voltage;
decouple the first input terminal of the converter circuit from the first terminal of the storage capacitor during the positive half-cycle, in response to determining that the voltage level across the storage capacitor is greater than the threshold voltage; and
decouple the first input terminal of the converter circuit from the first terminal of the storage capacitor during an entirety of each negative half-cycle of the input AC signal, to thereby prevent discharging of the storage capacitor by the input AC signal.

9. The converter circuit of claim 8, wherein:
the control circuitry comprises a first transistor, a second transistor, a diode, a controller, and a driver circuit;
the first transistor comprises a first terminal coupled to the first input terminal of the converter circuit, a second terminal coupled to a first node, and a gate terminal coupled to a second node;
the diode comprises an anode coupled to the first node, and a cathode coupled to the first terminal of the storage capacitor;
the second transistor comprises a first terminal coupled to the second node, a second terminal coupled to the second input terminal of the converter circuit, and a gate terminal coupled to an output of the controller;
the driver circuit is coupled between the first node and second node; and
the first terminal of the storage capacitor is coupled to an input of the controller.

10. The converter circuit of claim 9, wherein the driver circuit is configured to generate a regulated DC voltage on the second node using current drawn from the AC power supply during a negative half-cycle of the input AC signal, wherein the regulated DC voltage on the second node is configured to drive the first transistor.

11. The converter circuit of claim 10, wherein driver circuit comprises a voltage clamping circuit, wherein the voltage clamping circuit is configured to generate the regulated DC voltage, wherein the voltage clamping circuit comprises a capacitor and a Zener diode connected in parallel between the first and second nodes, wherein the regulated DC voltage comprises a Zener voltage of the Zener diode.

12. The converter circuit of claim 9, wherein the controller is configured to:
monitor the voltage level across the storage capacitor during the positive half-cycle of the input AC signal to determine whether the voltage level is greater than or less than the threshold voltage;
output a first control voltage on the gate terminal of the second transistor to activate the second transistor during the positive half-cycle, in response to determining that the voltage level across the storage capacitor is greater than the threshold voltage; and output a second control voltage on the gate terminal of the second transistor to deactivate the second transistor during the positive half-cycle, in response to determining that the voltage level across the storage capacitor is less than the threshold voltage.

13. The converter circuit of claim 12, wherein the first transistor is configured to be deactivated in response to the activation of the second transistor.

14. The converter circuit of claim 12, wherein the controller comprises a bang-bang controller.

15. The converter circuit of claim 14, wherein the threshold voltage comprises a programmable voltage set point of the bang-bang controller.

16. The converter circuit of claim 9, wherein the diode is configured to be forward-biased during each positive half-cycle of the input AC signal, and to be reverse-biased during each negative half-cycle of the input AC signal.

17. The converter circuit of claim 9, further comprising fault detection circuitry configured to (i) sense a level of current flowing in an electrical path of the converter circuit, (ii) detect an occurrence of a fault condition based on the sensed current level, and (iii) shunt the gate and source terminals of the first transistor, in response to detecting the occurrence of a fault condition.

18. A converter circuit, comprising:
   a first input terminal and a second input terminal, which are configured for connection to an alternating current (AC) power supply to receive as input an AC signal;
   control circuitry coupled to the first and second input terminals and configured to receive as input positive and negative half-cycles of the AC signal;
   a storage capacitor comprising a first terminal coupled to an output node of the control circuitry, and a second terminal coupled to the second input terminal; and
   a voltage regulator circuit comprising an input terminal coupled to the first terminal of the storage capacitor, and an output terminal coupled to a first output terminal of the converter circuit, wherein the voltage regulator circuit is configured to generate a regulated direct current (DC) voltage on the first output terminal of the converter circuit;
   wherein the control circuitry is configured to:
   couple the first input terminal of the converter circuit to the first terminal of the storage capacitor during a first portion and a second portion of each positive half-cycle of the input AC signal, which are collectively less than an entirety of the positive half-cycle of the input AC signal, to thereby charge the storage capacitor during the first and second portions of each positive half-cycle of the input AC signal; and
   decouple the first input terminal of the converter circuit from the first terminal of the storage capacitor during a third portion of each positive half-cycle of the input AC signal, and during an entirety of each negative half-cycle of the input AC signal, to thereby utilize the charged storage capacitor as a DC voltage source to drive the input terminal of the voltage regulator circuit to maintain the regulated DC voltage on the first output terminal of the converter circuit.

19. The converter circuit of claim 18, wherein the control circuitry comprises:
   a voltage divider circuit comprising a first resistor and a second resistor serially coupled between the first and second input terminals of the converter circuit;
   a first transistor;
   a second transistor; and
   a diode;
   wherein the first transistor comprises a first terminal coupled to the first input terminal of the converter circuit, and a second terminal coupled to an anode of the diode;
   wherein the second transistor comprises a gate terminal coupled to a node between the first and second resistors of the voltage divider circuit, a first terminal coupled to a gate terminal of the first transistor, and a second terminal coupled to the second input terminal of the converter circuit;
   wherein a cathode of the diode is coupled to the first terminal of the storage capacitor and to the input terminal of the voltage regulator circuit.

20. The converter circuit of claim 19, wherein the control circuitry is configured to:
   activate the first transistor during the first and second portions of each positive half-cycle of the input AC signal;
   deactivate the second transistor during the first and second portions of each positive half-cycle of the input AC signal and during the entirety of each negative half-cycle of the input AC signal; and
   activate the second transistor during the third portion of each positive half-cycle of the input AC signal;
   wherein activation of the second transistor causes deactivation of the first transistor during the third portion of each positive half-cycle of the input AC signal; and
   wherein the third portion of each positive half-cycle of the AC signal comprises a peak voltage of the AC signal, and is between the first and second portions of each positive half cycle.

* * * * *